(12) United States Patent  
Choi

(10) Patent No.: US 12,080,698 B2  
(45) Date of Patent: Sep. 3, 2024

(54) SEMICONDUCTOR PACKAGE

(71) Applicant: Samsung Electronics Co., Ltd., Suwon-si (KR)

(72) Inventor: Dongjoo Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 180 days.

(21) Appl. No.: 17/569,302

(22) Filed: Jan. 5, 2022

(65) Prior Publication Data

US 2022/0352138 A1 Nov. 3, 2022

(30) Foreign Application Priority Data

May 3, 2021 (KR) .......................... 10-2021-0057486

(51) Int. Cl.
| | |
|---|---|
| H01L 25/18 | (2023.01) |
| H01L 23/00 | (2006.01) |
| H01L 23/31 | (2006.01) |
| H01L 23/48 | (2006.01) |
| H01L 23/498 | (2006.01) |
| H01L 23/538 | (2006.01) |

(52) U.S. Cl.
CPC .......... *H01L 25/18* (2013.01); *H01L 23/3185* (2013.01); *H01L 23/481* (2013.01); *H01L 23/49811* (2013.01); *H01L 23/49833* (2013.01); *H01L 23/5383* (2013.01); *H01L 24/16* (2013.01); *H01L 2224/16146* (2013.01); *H01L 2224/16227* (2013.01)

(58) Field of Classification Search  
None  
See application file for complete search history.

(56) References Cited

U.S. PATENT DOCUMENTS

| | | | |
|---|---|---|---|
| 8,136,071 B2 | 3/2012 | Solomon | |
| 8,253,244 B2 | 8/2012 | Kang | |
| 9,167,694 B2 | 10/2015 | Sundaram et al. | |
| 9,170,948 B2 | 10/2015 | Loh et al. | |
| 9,209,156 B2 | 12/2015 | Len et al. | |
| 9,917,045 B2 | 3/2018 | Chaparala et al. | |
| 10,719,465 B2 * | 7/2020 | Best | ..... G11C 11/4096 |
| 10,880,994 B2 * | 12/2020 | Aoki | ....... H01L 24/17 |
| 11,387,224 B2 * | 7/2022 | Xu | ....... H01L 23/5386 |
| 2019/0355706 A1 | 11/2019 | Enquist et al. | |

(Continued)

*Primary Examiner* — Long Pham  
(74) *Attorney, Agent, or Firm* — Muir Patent Law, PLLC

(57) ABSTRACT

A semiconductor package includes an interposer substrate; an upper semiconductor chip on a top surface of the interposer substrate, such that a bottom surface of the upper semiconductor chip faces the top surface of the interposer substrate, a chip stack on a bottom surface of the interposer substrate and including a plurality of stacked lower semiconductor chips, wherein each of the lower semiconductor chips includes a plurality of through vias therein, wherein a top surface of the chip stack faces the bottom surface of the interposer substrate, a molding layer that covers a sidewall of the chip stack, a sidewall of the interposer substrate, and a sidewall of the upper semiconductor chip, and a plurality of connection terminals disposed below a bottom surface of the chip stack opposite the top surface of the chip stack, and coupled to the through vias. The upper semiconductor chip is electrically connected through the interposer substrate to the through vias.

20 Claims, 19 Drawing Sheets

(56) References Cited

U.S. PATENT DOCUMENTS

| | | |
|---|---|---|
| 2020/0111720 A1 | 4/2020 | Wan et al. |
| 2020/0118990 A1* | 4/2020 | Xu ..................... H01L 23/5383 |
| 2020/0402888 A1 | 12/2020 | Tsutsui et al. |
| 2023/0081139 A1* | 3/2023 | Valavala ............... H01L 25/105 |
| | | 257/776 |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2021-0057486 filed on May 3, 2021 in the Korean Intellectual Property Office, the disclosure of which is hereby incorporated by reference in its entirety.

BACKGROUND

The present inventive concepts relate to a semiconductor package, and more particularly, to a semiconductor package including stacked semiconductor chips.

A semiconductor package is provided to implement an integrated circuit chip to qualify for use in electronic products. Typically, a semiconductor package is configured such that a semiconductor chip is mounted on a printed circuit board (PCB) and bonding wires or bumps are used to electrically connect the semiconductor chip to the printed circuit board. With the development of the electronic industry, various research has been conducted to improve reliability and durability of semiconductor packages.

SUMMARY

Some embodiments of the present inventive concepts provide a semiconductor package whose electrical characteristics are improved.

Some embodiments of the present inventive concepts provide a compact-sized semiconductor package.

According to some embodiments of the present inventive concepts, a semiconductor package may comprise: an interposer substrate; an upper semiconductor chip on a top surface of the interposer substrate, such that a bottom surface of the upper semiconductor chip faces the top surface of the interposer substrate; a chip stack on a bottom surface of the interposer substrate, the chip stack including a plurality of stacked lower semiconductor chips, each of the lower semiconductor chips including a plurality of through vias therein, wherein a top surface of the chip stack faces the bottom surface of the interposer substrate; a molding layer that covers a sidewall of the chip stack, a sidewall of the interposer substrate, and a sidewall of the upper semiconductor chip; and a plurality of connection terminals disposed below a bottom surface of the chip stack opposite the top surface of the chip stack, and coupled to the through vias. The upper semiconductor chip may be electrically connected through the interposer substrate to the through vias.

According to some embodiments of the present inventive concepts, a semiconductor package may comprise: an interposer substrate; an upper semiconductor chip on a top surface of the interposer substrate; a plurality of chip stacks on a bottom surface of the interposer substrate and laterally spaced apart from each other; and a molding layer that covers sidewalls of the chip stacks, a sidewall of the interposer substrate, and a sidewall of the upper semiconductor chip. The molding layer may be between the chip stacks. Each of the chip stacks may include a plurality of stacked lower semiconductor chips.

According to some embodiments of the present inventive concepts, a semiconductor package may comprise: an interposer substrate that has a top surface and a bottom surface opposite the top surface; a logic chip disposed on the top surface of the interposer substrate and coupled to the interposer substrate; a plurality of chip stacks disposed on the bottom surface of the interposer substrate and laterally spaced apart from each other; a plurality of solder terminals below bottom surfaces of the chip stacks; and a molding layer that covers sidewalls of the chip stacks, a sidewall of the interposer substrate, and a sidewall of the logic chip. The molding layer may expose a top surface of the logic chip. Each of the chip stacks may include a plurality of stacked memory chips. Each of the memory chips may include a plurality of through vias therein. The solder terminals may be electrically connected through the through vias to the interposer substrate.

DETAILED DESCRIPTION OF EMBODIMENTS

Figure 1A:
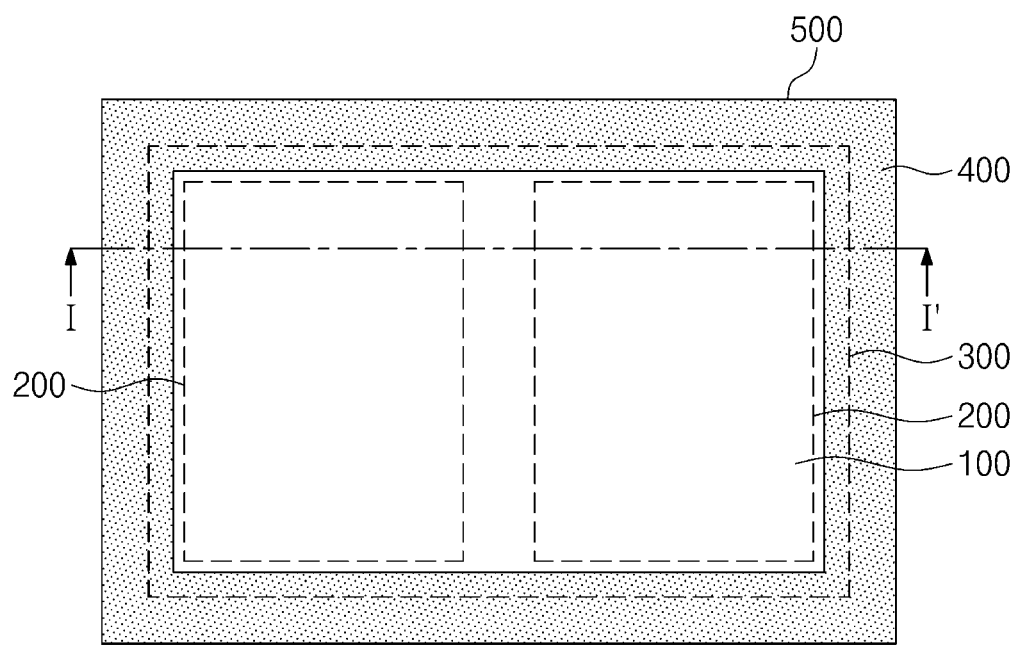
FIG. 1A illustrates a plan view showing a semiconductor package according to some embodiments.

In this description, like reference numerals may indicate like components. The following will now describe semiconductor packages according to the present inventive concepts.

Figure 1B:
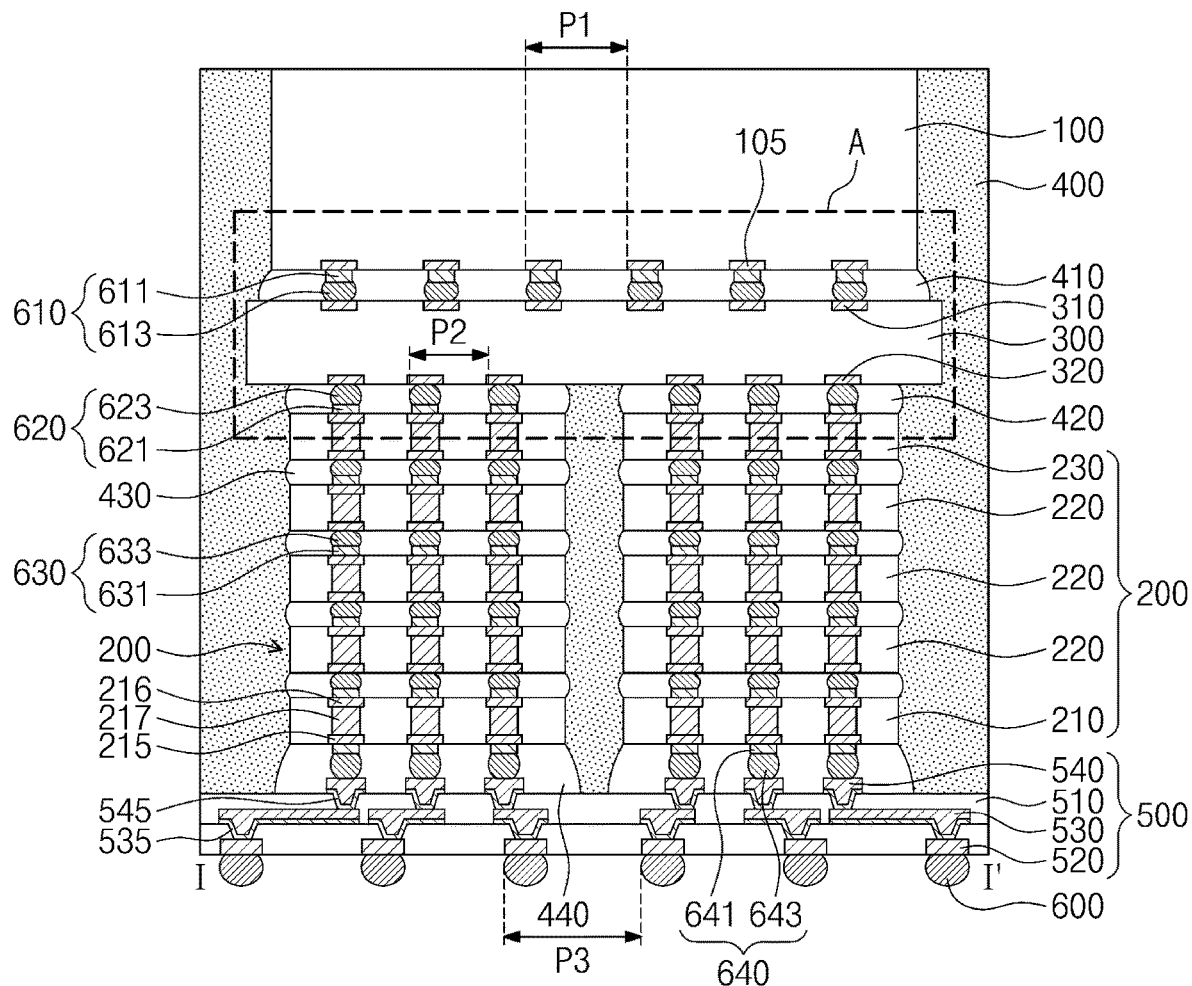
FIG. 1B illustrates a cross-sectional view taken along line I-I' of FIG. 1A.

FIG. 1A illustrates a plan view showing a semiconductor package according to some embodiments. FIG. 1B illustrates a cross-sectional view taken along line I-I' of FIG. 1A.

Referring to FIGS. 1A and 1B, a semiconductor package may include a substrate, solder terminals 600, chip stacks 200, an upper semiconductor chip 100, a redistribution substrate 500, and a molding layer 400. The semiconductor package may include an interposer substrate 300.

The interposer substrate 300 may include a top surface and a bottom surface that are opposite each other. Spatially relative terms, such as "beneath," "below," "lower," "above," "upper," "top," "bottom," and the like, may be used herein for ease of description to describe positional relationships, such as illustrated in the figures, for example. It will be understood that the spatially relative terms encompass different orientations of the device in addition to the orientation depicted in the figures. The interposer substrate 300 may include upper pads 310, lower pads 320, and wiring lines. The upper pads 310 and the lower pads 320 may be provided respectively on the top surface and the bottom surface of the interposer substrate 300. The wiring lines may be provided in the interposer substrate 300, and may be coupled to the upper pads 310 and the lower pads 320. The wiring lines may include wiring structures 315 which will be discussed in FIGS. 1C and 1D or second redistribution patterns 350 which will be discussed in FIGS. 1E and 1F. The phrase "coupled to the interposer substrate 300" may mean "coupled to the wiring lines." The upper pads 310, the lower pads 320, and the wiring lines may include or be formed of metal, such as one or more of copper, aluminum, tungsten, gold, nickel, and titanium. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim). It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

The upper semiconductor chip 100 may be located on the top surface of the interposer substrate 300. In some embodiments, the interposer substrate 300 includes wiring, such as redistribution wiring, and does not include any memory or logic circuitry thereon. The upper semiconductor chip 100 may include, for example, a logic chip or a system-on-chip (SOC). The upper semiconductor chip 100 may be, for example, an application specific integrated circuit (ASIC) chip or an application processor (AP) chip. The ASIC chip may include an application specific integrated circuit (ASIC). The upper semiconductor chip 100 may include a central processing unit (CPU) or a graphic processing unit (GPU).

The upper semiconductor chip 100 may include integrated circuits (not shown) and chip pads 105. The upper semiconductor chip 100 may not include a through electrode. The integrated circuits of the upper semiconductor chip 100 may be provided in the upper semiconductor chip 100. The chip pads 105 may be provided on a bottom surface of the upper semiconductor chip 100, and may be electrically connected to the integrated circuits of the upper semiconductor chip 100. The chip pads 105 may be conductive pads that include or are formed of a metal, such as aluminum, gold, or nickel. The chip pads 105 may have a pitch of about 10 μm to about 100 μm.

Upper bumps 610 may be interposed between the interposer substrate 300 and the upper semiconductor chip 100. For example, the upper bumps 610 may be coupled to the upper pads 310 and the chip pads 105 of the upper semiconductor chip 100. Therefore, the upper semiconductor chip 100 may be coupled through the upper bumps 610 to the interposer substrate 300. In this description, the phrase "electrically connected to a semiconductor chip" may mean "electrically connected to integrated circuits in the semiconductor chip." In addition, the phrase "electrically connected" in general refers to a connection that allows a signal or voltage to pass from one conductive component or circuit (e.g., a pad or bump) to another conductive component (e.g., an integrated circuit or a portion of an integrated circuit).

Each of the upper bumps 610, also referred to as upper chip connection terminals, may include an upper solder ball 613, also described generally as an upper solder or upper ball, and an upper pillar pattern 611, also described as an upper pillar. The upper pillar pattern 611 may be located on a bottom surface of a corresponding chip pad 105 of the upper semiconductor chip 100. The upper pillar pattern 611 may have a relatively uniform width. The upper pillar pattern 611 may be formed of or may include a metal, such as one or more of copper and titanium. The upper solder ball 613 may be interposed between the upper pillar pattern 611 and its corresponding upper pad 310. The upper solder ball 613 may include or be formed of a solder material. The solder material may include, for example, tin (Sn), silver (Ag), zinc (Zn), or any alloy thereof. Differently from that shown, the upper pillar pattern 611 may be omitted, and the upper solder ball 613 may be directly coupled to a bottom surface of a corresponding chip pad 105.

The upper bumps 610 may have a first pitch P1. The first pitch P1 may be a pitch in a range from about 10 μm to about 100 μm. The first pitch P1 may be substantially the same as a pitch of the chip pads 105 and a pitch of the upper pads 310. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise. Also, terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The semiconductor package may further include an upper under-fill layer 410. The upper under-fill layer 410 may be interposed between the interposer substrate 300 and the upper semiconductor chip 100, and may cover sidewalls of the upper bumps 610. The upper under-fill layer 410 may be formed of or may include a dielectric polymer, such as an epoxy-based polymer.

The chip stacks 200 may be located on the bottom surface of the interposer substrate 300. The chip stacks 200 may be laterally spaced apart from each other. The phrase "two components are laterally spaced apart from each other" may mean "the two components are horizontally spaced apart from each other." The language "horizontal" may indicate a direction "parallel to the bottom surface of the interposer substrate 300." The number of the chip stacks 200 may be variously changed without being limited to that shown in FIGS. 1A and 1B (though two chip stacks are depicted in FIGS. 1A and 1B).

Each of the chip stacks 200 may include lower semiconductor chips 210, 220, and 230 that are vertically stacked. In this description, the term "vertical" may indicate a direction "perpendicular to the bottom surface of the interposer substrate 300." For example, the lower semiconductor chips 210, 220, and 230 may include a first lower semiconductor chip 210, second lower semiconductor chips 220, and a third lower semiconductor chip 230. The second lower semiconductor chips 220 may be interposed between the first lower semiconductor chip 210 and the third lower semiconductor chip 230.

According to some embodiments, the first lower semiconductor chip 210 may be of a different type from the second lower semiconductor chips 220 and the third lower semiconductor chip 230. In this case, the first lower semiconductor chip 210 may be a logic chip or a controller chip, and may control the second and third lower semiconductor chips 220 and 230. The third lower semiconductor chip 230 may be of the same type as the second lower semiconductor chips 220. For example, the second and third lower semiconductor chips 220 and 230 may be memory chips. The memory chips may be or may include high bandwidth memory (HBM) chips.

According to some embodiments, the third lower semiconductor chip 230 may be of a different type from the second lower semiconductor chips 220 and the first lower semiconductor chip 210. In this case, the third lower semiconductor chip 230 may be a logic chip or a controller chip, and may control the first and second lower semiconductor chips 210 and 220. The first lower semiconductor chip 210 may be of the same type as the second lower semiconductor chips 220. The first and second lower semiconductor chips 210 and 220 may be memory chips. The sum total of the first, second, and third lower semiconductor chips 210, 220, and 230 may be 4n+1 (n is an integer equal to or greater than 1), but the present inventive concepts are not limited thereto.

Each of the first, second, and third lower semiconductor chips 210, 220, and 230 may include integrated circuits (not shown), lower conductive pads 215, through vias 217, and upper conductive pads 216. The integrated circuits may be correspondingly provided in the first, second, and third lower semiconductor chips 210, 220, and 230. The lower conductive pads 215 may be correspondingly provided on bottom surfaces of the first, second, and third lower semiconductor chips 210, 220, and 230, and may be coupled to the integrated circuits. The through vias 217 may be provided in the first, second, and third lower semiconductor chips 210, 220, and 230. Each of the through vias 217 may penetrate a corresponding one of the first, second, and third lower semiconductor chips 210, 220, and 230. Each of the through vias 217 may be coupled to at least one selected from corresponding lower conductive pads 215 and corresponding integrated circuits. The through vias 217 may be described as through conductive vias, through substrate vias, or conductive vias and may be formed of or may include metal, such as copper, titanium, or any alloy thereof. The upper pads 310 may be correspondingly provided on top surfaces of the first, second, and third lower semiconductor chips 210, 220, and 230, and may be coupled to the through vias 217. The lower conductive pads 215 and the upper conductive pads 216 may be formed of or may include metal, such as aluminum, gold, nickel, copper, or tungsten. Pads, as described herein and unless otherwise noted, have at least one flat surface that connects to another conductive component, and which may have a circular shape from a plan view. Pads may have two opposite flat surfaces for connecting to other conductive components.

Each of the chip stacks 200 may further include first bump patterns 630. The first bump patterns 630 may be correspondingly provided between the first, second, and third lower semiconductor chips 210, 220, and 230. For example, the first bump patterns 630 may be coupled to the lower conductive pads 215 and the upper conductive pads 216 that face each other and are included in adjacent ones of the first, second, and third lower semiconductor chips 210, 220, and 230. The first, second, and third lower semiconductor chips 210, 220, and 230 may be electrically connected to each other through the first bump patterns 630.

Each of the first bump patterns 630 may include a first solder ball 633, also described as a first solder or first ball, and a first pillar pattern 631. The first pillar pattern 631 may be provided on the upper conductive pad 216 that corresponds thereto. The first pillar pattern 631 may be formed of or include a metal, such as copper. The first solder ball 633 may be provided on the first pillar pattern 631, and may include a different material from that of the first pillar pattern 631. For example, the first solder ball 633 may be formed of or may include a solder material.

Each of the chip stacks 200 may further include a first under-fill pattern 430. The first under-fill patterns 430 may be provided between the first and second lower semiconductor chips 210 and 220, between the second lower semiconductor chips 220, and between the second and third lower semiconductor chips 220 and 230. The first under-fill pattern 430 may encapsulate corresponding first bump patterns 630. The first under-fill pattern 430 may be formed of or may include a dielectric polymer, such as an epoxy-based polymer.

The semiconductor package may further include lower bumps 620. The lower bumps 620 may be correspondingly interposed between the chip stacks 200 and the interposer substrate 300. The lower bumps 620, also described as interposer connection terminals, may be coupled to the lower pads 320 and the upper conductive pads 216 of the third lower semiconductor chip 230. Therefore, the chip stacks 200 may be electrically connected to the interposer substrate 300. The upper semiconductor chip 100 may be electrically connected through the interposer substrate 300 to at least one selected from the first, second, and third lower semiconductor chips 210, 220, and 230. In this description, the phrase "electrically connected to the chip stacks 200" may mean "electrically connected to the integrated circuits of at least one selected from the first, second, and third lower semiconductor chips 210, 220, and 230," such that a voltage or electrical signals pass between the components described as electrically connected to each other. The phrase "electrically connected to the chip stacks 200" may also mean "electrically connected to the through vias 217 of the first, second, and third lower semiconductor chips 210, 220, and 230."

The lower bumps 620 may have a second pitch P2. The second pitch P2 may be a pitch in the range from about 10 µm to about 100 µm. The second pitch P2 may be the same as or less than the first pitch P1. The second pitch P2 may be substantially the same as a pitch of the lower pads 320 and a pitch of the upper conductive pads 216 included in the third lower semiconductor chip 230.

Each of the lower bumps 620 may include a lower solder ball 623, also described as a lower solder or a lower ball, and a lower pillar pattern 621. The lower pillar pattern 621 may be located on its corresponding upper conductive pad 216 of the third lower semiconductor chip 230. The lower solder ball 623 may be provided between the lower pillar pattern 621 and its corresponding lower pad 320. The lower solder ball 623 may include a different material from that of the lower pillar pattern 621. For example, the lower pillar pattern 621 may be or include copper, and the lower solder ball 623 may be or include a solder material.

The semiconductor package may further include lower under-fill layers 420. The lower under-fill layers 420 may be interposed between the chip stacks 200 and the interposer substrate 300, and may encapsulate the lower bumps 620. The lower under-fill layer 420 may be formed or of may include a dielectric polymer, such as an epoxy-based polymer.

The molding layer 400 may be provided on the top surface of the interposer substrate 300, sidewalls of the chip stacks 200, sidewalls of the interposer substrate 300, and sidewalls of the upper semiconductor chip 100. The molding layer 400 may be provided between the chip stacks 200. The molding layer 400 may be formed of or may include a dielectric polymer, such as an epoxy-based molding compound (EMC). The molding layer 400 may include a different material from that of the upper under-fill layer 410, that of the lower under-fill layer 420, and that of the first under-fill pattern 430. When the semiconductor package operates, a relatively large amount of heat may be generated from the upper semiconductor chip 100. The molding layer 400 may have thermal conductivity less than that of the upper semiconductor chip 100. The molding layer 400 may expose a top surface of the upper semiconductor chip 100. Accordingly, heat may be promptly discharged from the upper semiconductor chip 100.

The redistribution substrate 500 may be provided on bottom surfaces of the chip stacks 200 and a bottom surface of the molding layer 400. The redistribution substrate 500 may be directly in physical contact with (e.g., may contact) the bottom surface of the molding layer 400. An outer sidewall of the redistribution substrate 500 may be vertically aligned with, and coplanar with an outer sidewall of the molding layer 400.

The redistribution substrate 500 may include organic layers 510, first redistribution patterns 530, and redistribution pads 540. The redistribution substrate 500 may further include under-bump patterns 520, but the present inventive concepts are not limited thereto. The organic layers 510 may be stacked on each other. The organic layers 510 may be organic dielectric layers. The organic layers 510 may be formed of or may include a photo-imageable dielectric (PID) material. The photo-imageable dielectric material may be or may include at least one selected from photosensitive polyimide, polybenzoxazole, phenolic polymers, and benzocyclobutene polymers. No distinct interface may be provided between the organic layers 510. The under-bump patterns 520 may be provided in a lowermost organic layer 510. In one embodiment, the lowermost organic layer 510 do not cover bottom surfaces of the under-bump patterns 520. The under-bump patterns 520 may include or may be metal, such as copper.

The first redistribution patterns 530 may be correspondingly provided on and coupled to the under-bump patterns 520. Each of the first redistribution patterns 530 may include a first via part and a first line part. The first via part may be provided in a corresponding organic layer 510. The first line part may be provided on the first via part, and the first line part and the first via part may be connected to each other with no boundary. The first line part may have a width (in a horizontal direction) greater than that of the first via part. The redistribution substrate 500 may further include first seed layers 535. The first seed layers 535 may be correspondingly provided on bottom surfaces of the first redistribution patterns 530. The first seed layers 535 may be formed of or may include, for example, titanium or copper.

The redistribution pads 540 may be correspondingly provided on and coupled to the first redistribution patterns 530. Each of the redistribution pads 540 may be provided in or on an uppermost organic layer 510. The redistribution pads 540 may be formed of or may include metal, such as one or more of copper, gold, and nickel. The redistribution substrate 500 may further include first seed pads 545. The first seed pads 545 may be correspondingly provided on bottom surfaces of the redistribution pads 540. The first seed pads 545 may be formed of or may include, for example, titanium or copper.

The solder terminals 600 may be provided on a bottom surface of the redistribution substrate 500. For example, the solder terminals 600 may be provided on the bottom surfaces of the under-bump patterns 520, and may be correspondingly coupled to the under-bump patterns 520. The solder terminals 600 may be coupled through the first redistribution patterns 530 to the redistribution pads 540. The phrase "coupled to the redistribution substrate 500" may mean "coupled to at least one of the first redistribution patterns 530," or may refer to being coupled to one or more conductive components of the redistribution substrate 500 for transmitting signals or voltage. The solder terminals 600 may be electrically separated from each other. The solder terminals 600 may be solder balls, and may generally be referred to as package external connection terminals.

Some of the solder terminals 600 may be provided on the bottom surfaces of the chip stacks 200 (e.g., to overlap the chip stacks 200 from a plan view). Other solder terminals 600 may vertically overlap the bottom surface of the molding layer 400 (e.g., to overlap the molding layer 400 but not overlap the chip stacks 200 from a plan view). Because the redistribution substrate 500 is provided, the solder terminals 600 may be freely disposed without being limited to position of the lower conductive pads 215 of the first lower semiconductor chip 210. Therefore, the solder terminals 600 may have a third pitch P3, which third pitch P3 may be relatively large. For example, the third pitch P3 (e.g., minimum third pitch P3) may be greater than each of the first pitch P1 and the second pitch P2 (e.g., minimum first pitch P1 and minimum second pitch P2). The third pitch P3 may be greater than a pitch of the first bump patterns 630. For example, the third pitch P3 may range from about 101 μm to about 1,000 μm. A pitch, as referred to herein, refers to a distance between same points (e.g., left sides) of two immediately adjacent components, such as two pad, bumps, or balls.

The semiconductor package may further include second bump patterns 640. The second bump patterns 640 may be located between the redistribution substrate 500 and the chip stacks 200. The chip stacks 200 may be electrically connected through the second bump patterns 640 to the redistribution substrate 500. The second bump patterns 640 may also be referred to generally as chip stack connection terminals. Each of the second bump patterns 640 may include a second solder ball 643 and a second pillar pattern 641. The second pillar pattern 641 may be provided on a bottom surface of a corresponding lower conductive pad 215 of the first lower semiconductor chip 210. The second pillar pattern 641 may be formed of or may include metal, such as copper. The second solder ball 643 may be provided on a bottom surface of the second pillar pattern 641 and may be coupled to a corresponding redistribution pad 540. The second bump patterns 640 may have a pitch less than the third pitch P3. The pitch of the second bump patterns 640 may be a pitch in a range from about 10 μm to about 100 μm. The third pitch P3 may be about 5 times to about 20 times the pitch of the second bump patterns 640.

The semiconductor package may further include one or more second under-fill patterns 440. The second under-fill patterns 440 may be correspondingly provided between the redistribution substrate 500 and the chip stacks 200, and may encapsulate the second bump patterns 640. The second under-fill pattern 440 may include a dielectric polymer, such as an epoxy-based polymer. The second under-fill pattern 440 may include a different material from that of the molding layer 400.

When the chip stacks 200 are located on a top surface of the interposer substrate 300, the upper semiconductor chip 100 and the chip stacks 200 may be electrically connected to each other through horizontal paths in the interposer substrate 300. The horizontal paths may be relatively long, and thus signal transfer speeds may be reduced. According to some embodiments, the upper semiconductor chip 100 may be electrically connected to the first, second, and third lower semiconductor chips 210, 220, and 230 through vertical paths in the interposer substrate 300. In this case, electrical path lengths in the interposer substrate 300 may be reduced to increase signal transfer speeds between the upper semiconductor chip 100 and the chip stacks 200. The semiconductor package may exhibit improved electrical characteristics. In the above example, as well as examples below, the interposer substrate 300 covers an entire area, from a plan view, occupied by the upper semiconductor chip 100 and by the chip stacks 200. From a plan view, the interposer chip may have an area greater than that of the upper semiconductor chip 100, and greater than that of each chip stack individually and the group of chip stacks combined. In addition, the interposer substrate 300 does not have an opening, for example, in which one or more chips are disposed. Also, as discussed, according to the embodiment of FIGS. 1A-1B (and other embodiments), a plurality of HBM chips may be formed on a bottom surface of an interposer substrate, and a non HBM chip may be formed on an opposite, top surface of the interposer substrate.

The following will discuss an interposer substrate according to some embodiments.

Figure 1C:
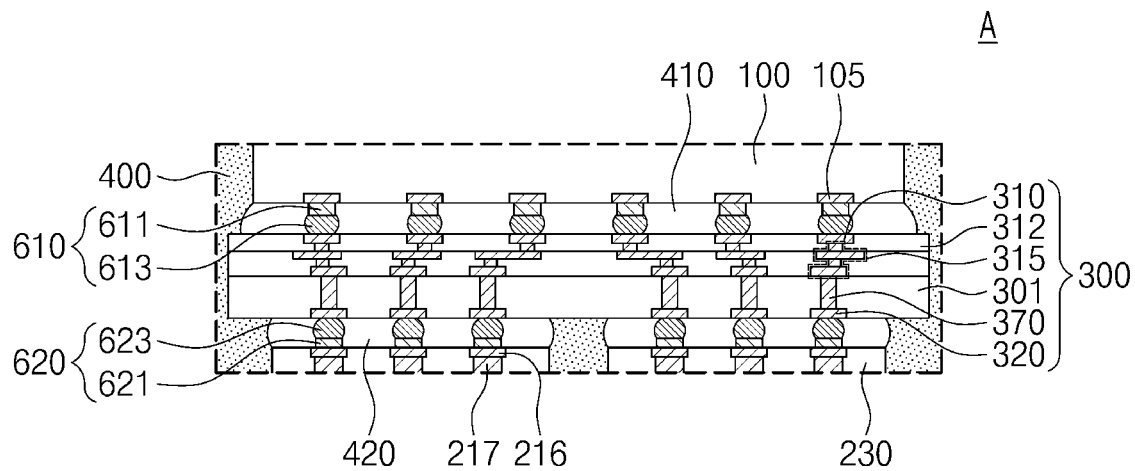
FIG. 1C illustrates a cross-sectional view showing an interposer substrate according to some embodiments.

FIG. 1C illustrates an enlarged cross-sectional view of section A depicted in FIG. 1B, showing an interposer substrate according to some embodiments.

Referring to FIG. 1C, the interposer substrate 300 may be a semiconductor interposer substrate. The semiconductor interposer substrate may include a semiconductor substrate 301, conductive vias 370, dielectric layers 312, wiring lines, upper pads 310, and lower pads 320. The lower pads 320 may be provided on a bottom surface of the semiconductor substrate 301. The conductive vias 370 may penetrate the semiconductor substrate 301 and may be correspondingly coupled to the lower pads 320. The dielectric layers 312 may be stacked on a top surface of the semiconductor substrate 301. The wiring lines of the interposer substrate 300 may include wiring structures 315. The wiring structures 315 may be provided in or between the dielectric layers 312. The upper pads 310 may be provided on an uppermost dielectric layer 312. The upper pads 310 may be coupled through the wiring structures 315 to the conductive vias 370. The conductive vias 370 and the wiring structures 315 may be formed of or may include metal, such as one or more of copper, tungsten, and titanium.

Figure 1D:
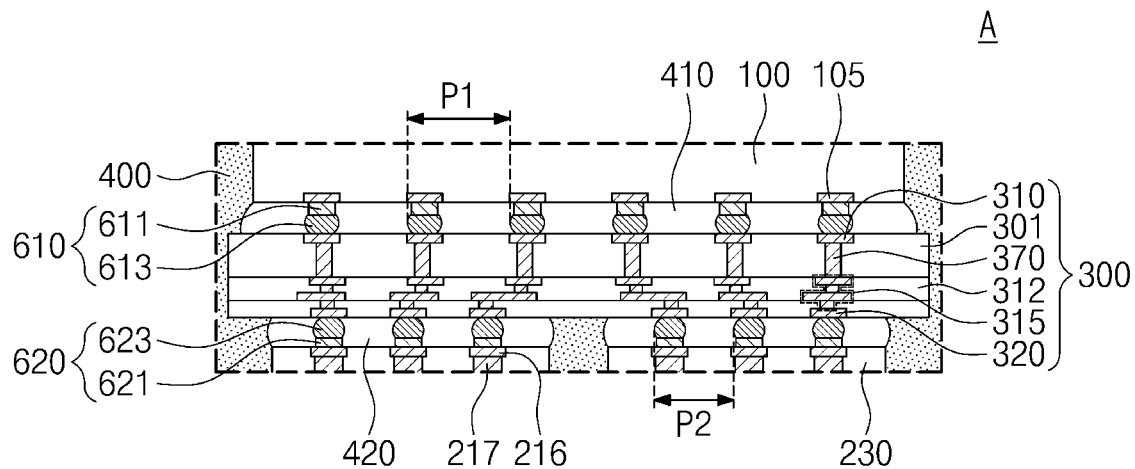
FIG. 1D illustrates a cross-sectional view showing an interposer substrate according to some embodiments.

FIG. 1D illustrates an enlarged cross-sectional view of section A depicted in FIG. 1B, showing an interposer substrate according to some embodiments.

Referring to FIG. 1D, as discussed in FIG. 1C, the interposer substrate 300 may include a semiconductor substrate 301, conductive vias 370, dielectric layers 312, wiring structures 315, upper pads 310, and lower pads 320. The dielectric layers 312 may be provided on a bottom surface of the semiconductor substrate 301. The lower pads 320 may be provided in a lowermost dielectric layer 312 or on a bottom surface of the lowermost dielectric layer 312. The upper pads 310 may be provided on a top surface of the semiconductor substrate 301.

Figure 1E:
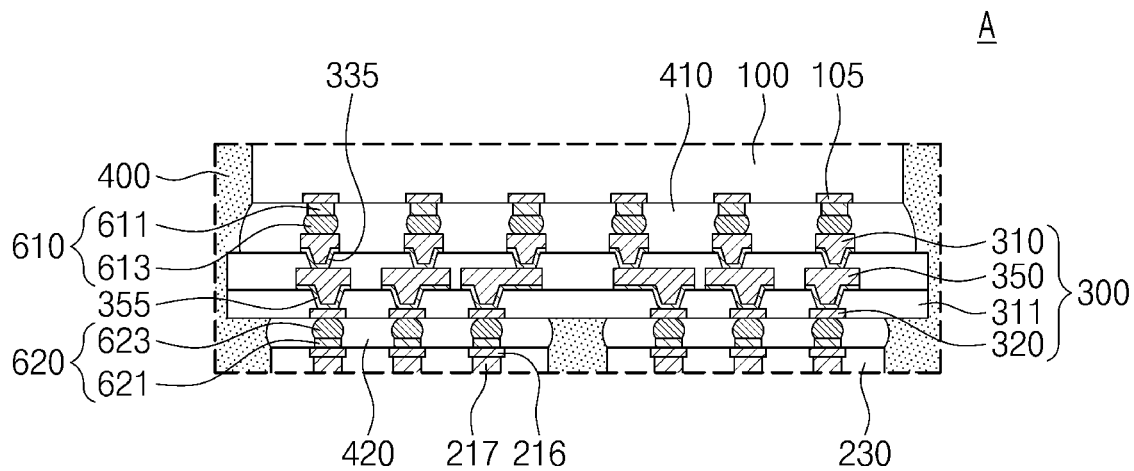
FIG. 1E illustrates a cross-sectional view showing an interposer substrate according to some embodiments.

FIG. 1E illustrates an enlarged cross-sectional view of section A depicted in FIG. 1B, showing an interposer substrate according to some embodiments.

Referring to FIG. 1E, the interposer substrate 300 may be a redistribution layer. The redistribution layer may include organic dielectric layers 311, second redistribution patterns 350, lower pads 320, and upper pads 310. The organic dielectric layers 311 may be vertically stacked. The organic dielectric layers 311 may be formed of or may include, for example, a photo-imageable dielectric material. No distinct interface may be provided between the organic dielectric layers 311. The lower pads 320 may be provided in a lowermost organic dielectric layer 311. The second redistribution patterns 350 may be provided in the organic dielectric layers 311. The second redistribution patterns 350 may be correspondingly provided on and coupled to the lower pads 320. Each of the second redistribution patterns 350 may include a second via part and a second line part that are connected to each other. The second line part may be provided on the second via part, and may have a width (e.g., in a horizontal direction) greater than that of the second via part. The upper pads 310 may be correspondingly to, located on, and coupled to the second redistribution patterns 350.

The redistribution layer may further include second seed layers 355 and second seed pads 335. The second seed layers 355 may be correspondingly provided on bottom surfaces of the second redistribution patterns 350. The second seed pads 335 may be provided on bottom surfaces of the upper pads 310. The second seed layers 355 and the second seed pads 335 may be formed of or may include, for example, copper, titanium, or any alloy thereof.

Figure 1F:
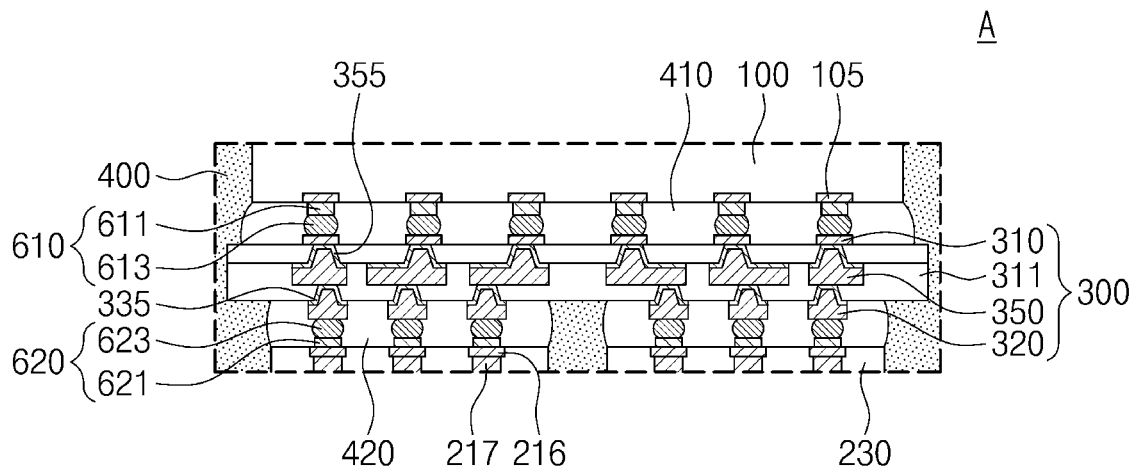
FIG. 1F illustrates a cross-sectional view showing an interposer substrate according to some embodiments.

FIG. 1F illustrates an enlarged cross-sectional view of section A depicted in FIG. 1B, showing an interposer substrate according to some embodiments.

Referring to FIG. IF, the interposer substrate 300 may be a redistribution layer. Similar to that discussed in FIG. 1E, the interposer substrate 300 may include organic dielectric layers 311, second redistribution patterns 350, second seed layers 355, second seed pads 335, lower pads 320, and upper pads 310. Each of the second redistribution patterns 350 may include a second line part and a second via part provided on the second line part. The second seed layers 355 may be provided on top surfaces of the redistribution pads 540. The second seed pads 335 may be correspondingly provided on top surfaces of the lower pads 320 and may be coupled to the redistribution patterns 350.

Figure 2:
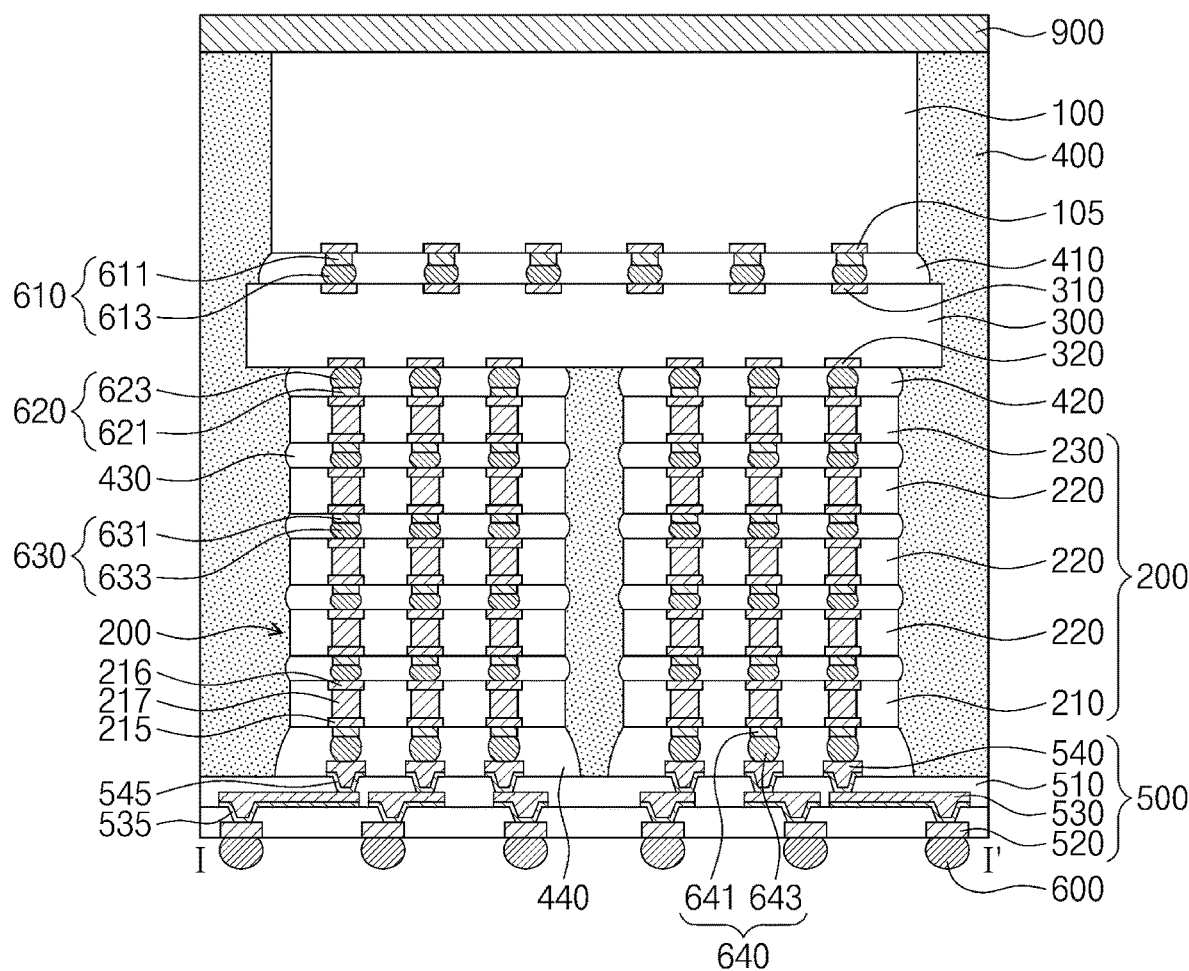
FIG. 2 illustrates a cross-sectional view showing a semiconductor package according to some embodiments.

FIG. 2 illustrates a cross-sectional view taken along line I-I' of FIG. 1A, showing a semiconductor package according to some embodiments.

Referring to FIG. 2, a semiconductor package may include a redistribution substrate 500, solder terminals 600, chip stacks 200, an interposer substrate 300, an upper semiconductor chip 100, and a molding layer 400. Each of the chip stacks 200 may include first bump patterns 630. Each of the first bump patterns 630 may include a first solder ball 633 and a first pillar pattern 631. Differently from that shown in FIG. 1B, the first solder ball 633 may be coupled to a corresponding upper conductive pad 216. The first pillar pattern 631 may be provided on a top surface of the first solder ball 633. The first pillar pattern 631 may be coupled to the first solder ball 633 and its corresponding lower conductive pad 215.

The semiconductor package may further include a thermal radiation structure 900. The thermal radiation structure 900 may be provided on a top surface of the upper semiconductor chip 100 and a top surface of the molding layer 400. Although not shown, the thermal radiation structure 900 may extend onto outer walls of the molding layer 400. The thermal radiation structure 900 may be formed of or may include at least one selected from a heat sink, a heat slug, and a thermal interface material (TIM) layer. The thermal radiation structure 900 may have a thermal expansion coefficient greater than that of the molding layer 400. When the semiconductor package operates, heat may be promptly discharged through the thermal radiation structure 900 from the upper semiconductor chip 100. The thermal radiation structure 900 may be formed of or may include metal, such as copper. The thermal radiation structure 900 may protect external physical impact to thereby protect the upper semiconductor chip 100.

The thermal radiation structure 900 may have electrical conductivity to serve as an electromagnetic field shield layer. In this case, the thermal radiation structure 900 may shield electromagnetic interference (EMI) of the chip stacks 200 and the upper semiconductor chip 100.

Figure 3A:
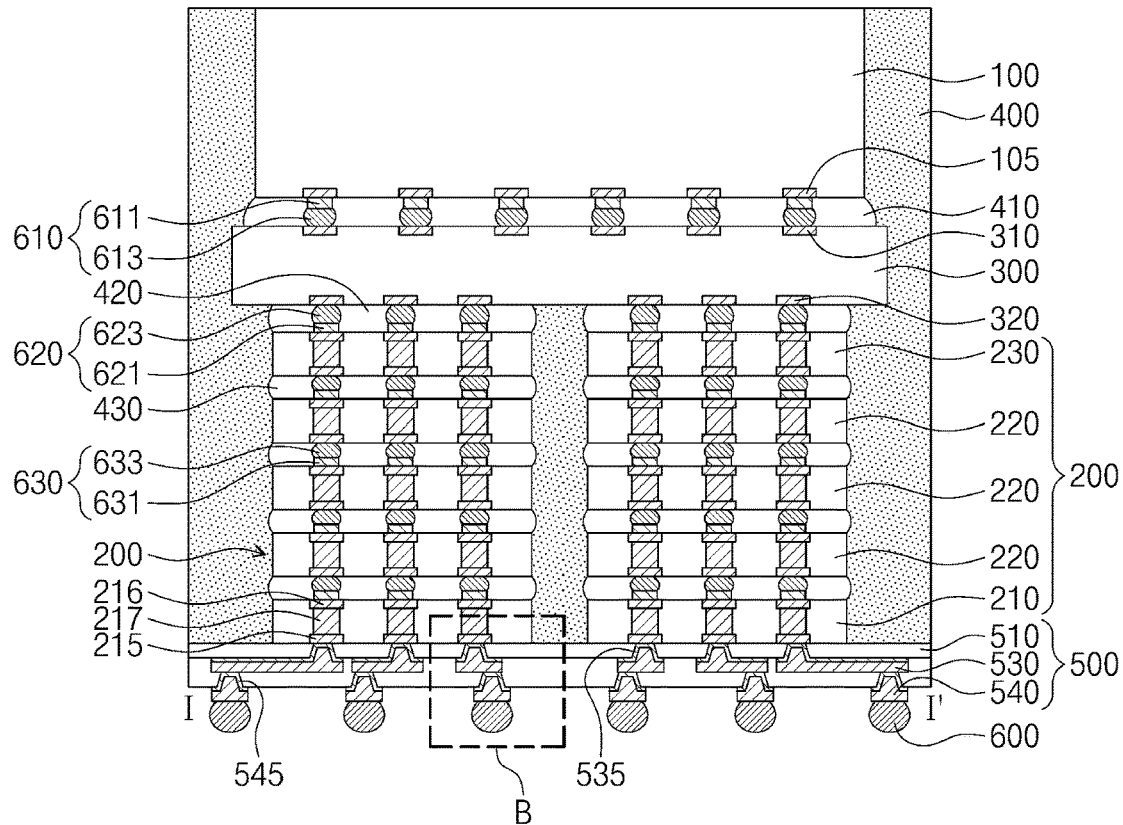
FIG. 3A illustrates a cross-sectional view showing a semiconductor package according to some embodiments.
Figure 3B:
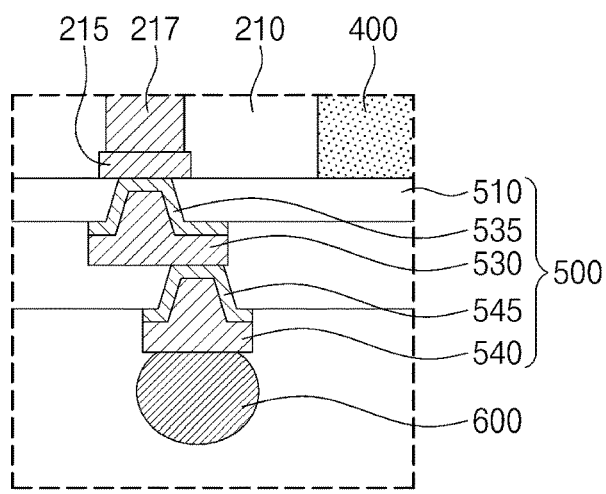
FIG. 3B illustrates an enlarged view showing section B of FIG. 3A.

FIG. 3A illustrates a cross-sectional view taken along line I-I' of FIG. 1A, showing a semiconductor package according to some embodiments. FIG. 3B illustrates an enlarged view showing section B of FIG. 3A.

Referring to FIGS. 3A and 3B, a semiconductor package may include a redistribution substrate 500, solder terminals 600, chip stacks 200, an interposer substrate 300, an upper semiconductor chip 100, and a molding layer 400. The semiconductor package may include none of the second under-fill patterns 440 and the second bump patterns 640 discussed in FIG. 1B.

The redistribution substrate 500 may include organic layers 510, first redistribution patterns 530, and redistribution pads 540. The redistribution substrate 500 may include the under-bump patterns 520 discussed in FIG. 1B. The redistribution substrate 500 (e.g., an upper surface thereof) may contact the first lower semiconductor chip 210 and the molding layer 400 (e.g., lower surfaces thereof). For example, an uppermost organic layer 510 (e.g., an upper surface thereof) may contact a bottom surface of the first lower semiconductor chip 210 and a bottom surface of the molding layer 400. Each of the first redistribution patterns 530 may include a first line part and a first via part provided on the first line part. The first via part may be provided on a bottom surface of a corresponding lower conductive pad 215 of the first lower semiconductor chip 210. Each of the first seed layers 535 may be interposed between the first redistribution pattern 530 and the lower conductive pad 215. Each of the first seed layers 535 may be directly coupled to a bottom surface of a corresponding lower conductive pad 215. The lower conductive pad 215 may serve as a chip stack connection terminal, at an outer surface of the chip stack 200 and electrically and physically connecting the chip stack to the redistribution substrate 500.

The redistribution pads 540 may be correspondingly provided on bottom surfaces of the first redistribution patterns 530. The redistribution pads 540 may be provided in a lowermost organic layer 510 or on a bottom surface of the lower organic layer 510. The first seed pads 545 may be provided on top surfaces of the redistribution pads 540. The solder terminals 600 may be provided on bottom surfaces of the redistribution pads 540 and may be coupled to the redistribution pads 540. The redistribution pads 540 may serve as under-bump patterns of the solder terminals 600.

The redistribution substrate 500 may be fabricated in a chip first scheme, but the present inventive concepts are not limited thereto.

Figure 4:
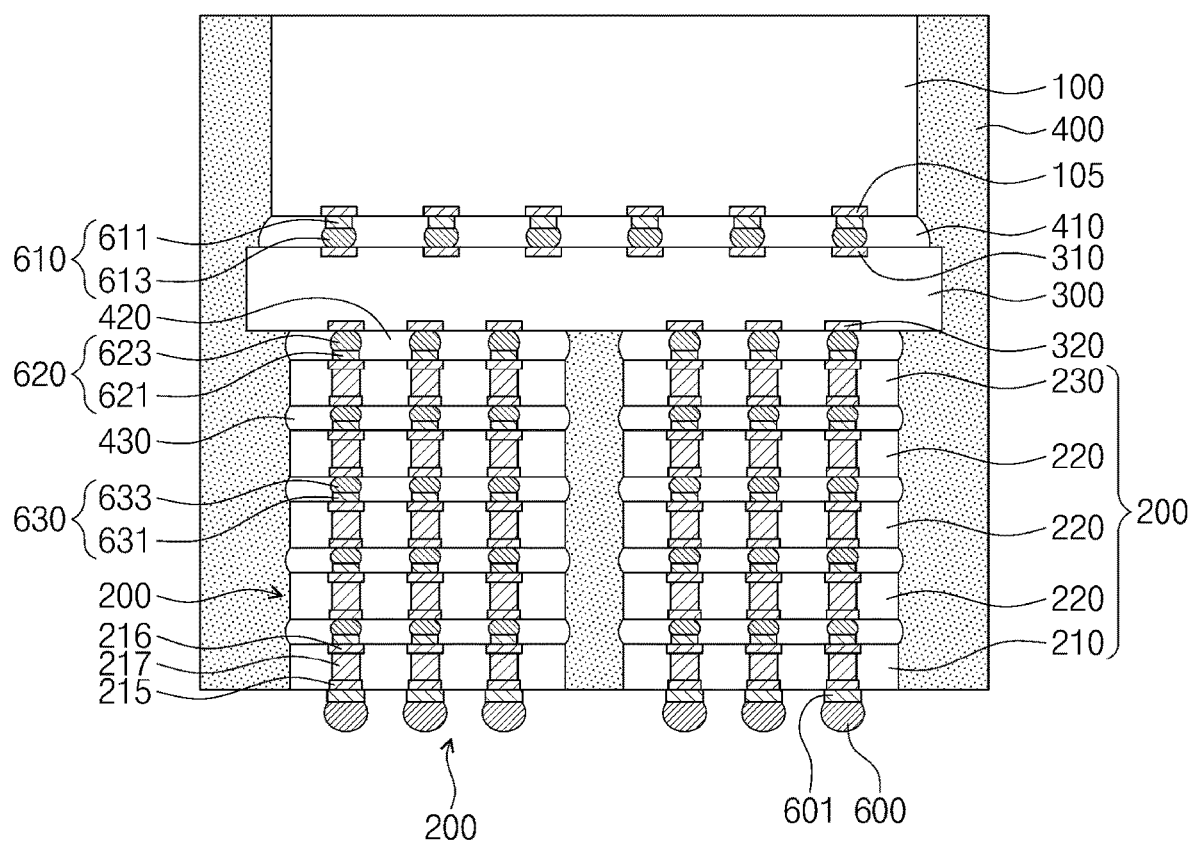
FIG. 4 illustrates a cross-sectional view showing a semiconductor package according to some embodiments.

FIG. 4 illustrates a cross-sectional view showing a semiconductor package according to some embodiments.

Referring to FIG. 4, a semiconductor package may include solder terminals 600, chip stacks 200, an interposer substrate 300, an upper semiconductor chip 100, and a molding layer 400. The semiconductor package may not include the redistribution substrate 500 discussed in FIGS. 1A and 1B. The solder terminals 600 may be correspondingly provided on bottom surfaces of the chip stacks 200. For example, the solder terminals 600 may be correspondingly provided on bottom surfaces of the lower conductive pads 215 included in the first lower semiconductor chip 210.

The semiconductor package may further include conductive pillars 601. The conductive pillars 601 may be interposed between the solder terminals 600 and the lower conductive pads 215 of the first lower semiconductor chip 210. The conductive pillars 601 may be formed of or may include metal, such as copper. In this embodiment, neither the conductive pillars 601 nor the solder terminals 600 may be provided on a bottom surface of the molding layer 400. Thus, neither the conductive pillars 601 nor the solder terminals 600 may vertically overlap the molding layer 400.

Figure 5A:
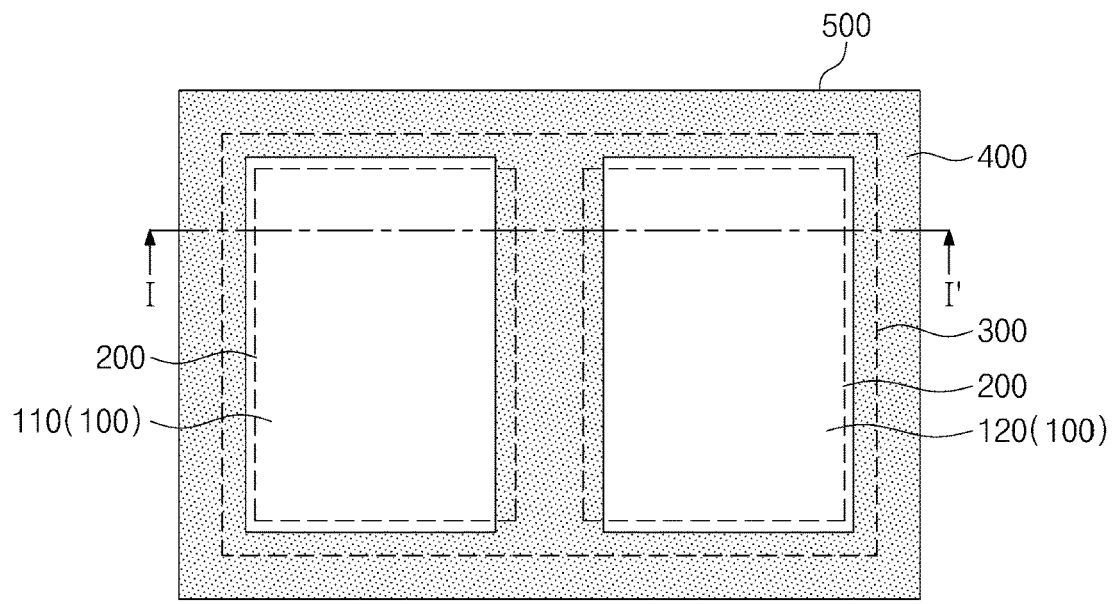
FIG. 5A illustrates a plan view showing a semiconductor package according to some embodiments.
Figure 5B:
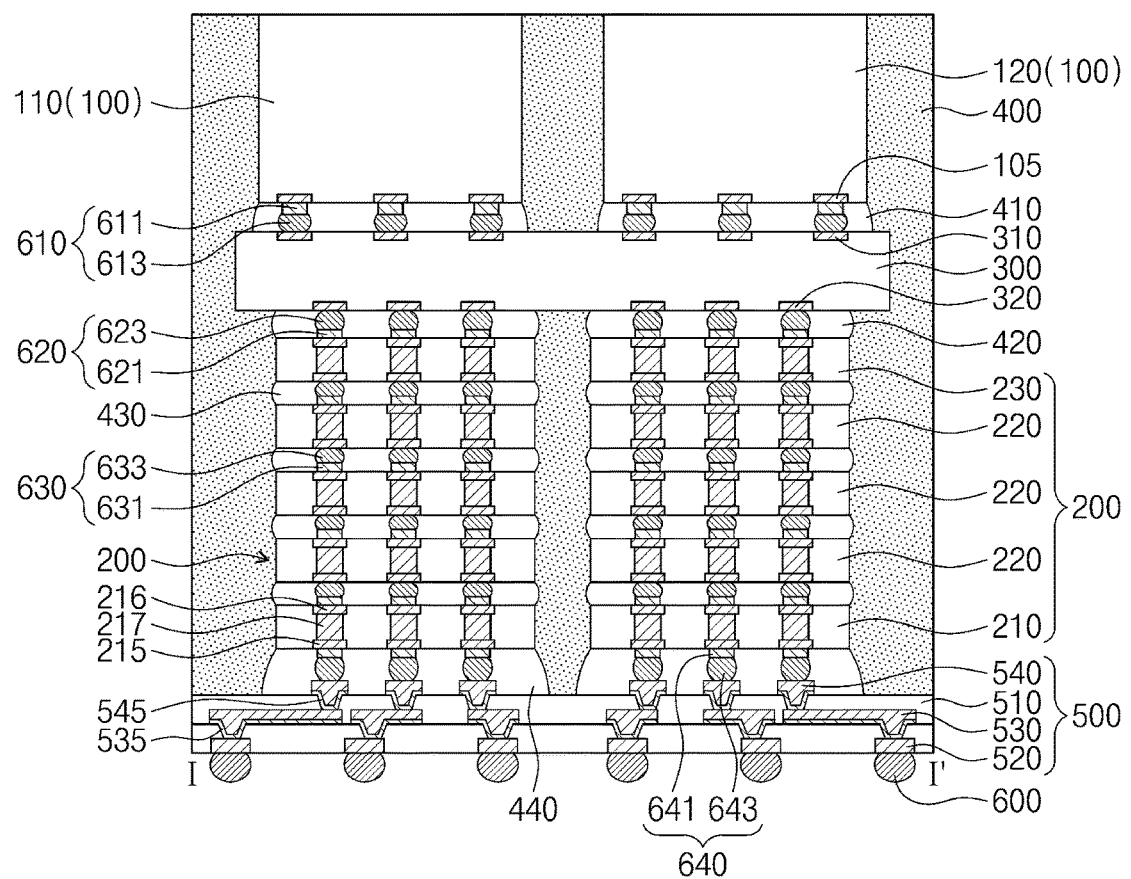
FIG. 5B illustrates a cross-sectional view taken along line I-I' of FIG. 5A.

FIG. 5A illustrates a plan view showing a semiconductor package according to some embodiments. FIG. 5B illustrates a cross-sectional view taken along line I-I' of FIG. 5A.

Referring to FIGS. 5A and 5B, a semiconductor package may include solder terminals 600, a redistribution substrate 500, chip stacks 200, an interposer substrate 300, an upper semiconductor chip 100, and a molding layer 400. The upper semiconductor chip 100 may include a plurality of upper semiconductor chips. The plurality of upper semiconductor chips 100 may be laterally spaced apart from each other on a top surface of the interposer substrate 300. The upper semiconductor chips 100 may include a first upper semiconductor chip 110 and a second upper semiconductor chip 120. Each of the first and second upper semiconductor chips 110 and 120 may be coupled through the interposer substrate 300 to at least one of the chip stacks 200. Each of the first and second upper semiconductor chips 110 and 120 may be coupled to the solder terminals 600 through the interposer substrate 300, the through vias 217, and the redistribution substrate 500. For example, the first upper semiconductor chip 110 may be electrically connected through the interposer substrate 300 to the second upper semiconductor chip 120, but the present inventive concepts are not limited thereto.

For example, the second upper semiconductor chip 120 may be of the same type as the first upper semiconductor chip 110. The second upper semiconductor chip 120 may have substantially the same size as that of the first upper semiconductor chip 110. Alternatively, the second upper semiconductor chip 120 may be of a different type (e.g., logic chip) from the first upper semiconductor chip 110. For example, the first upper semiconductor chip 110 may be a semiconductor chip including a central processing unit (CPU), and the second upper semiconductor chip 120 may be a semiconductor chip including a graphic processing unit (GPU). The second upper semiconductor chip 120 may have a different size from that of the first upper semiconductor chip 110, but the present inventive concepts are not limited thereto.

A plurality of upper under-fill layers 410 may be correspondingly interposed between the interposer substrate 300 and the upper semiconductor chips 100.

Figure 6:
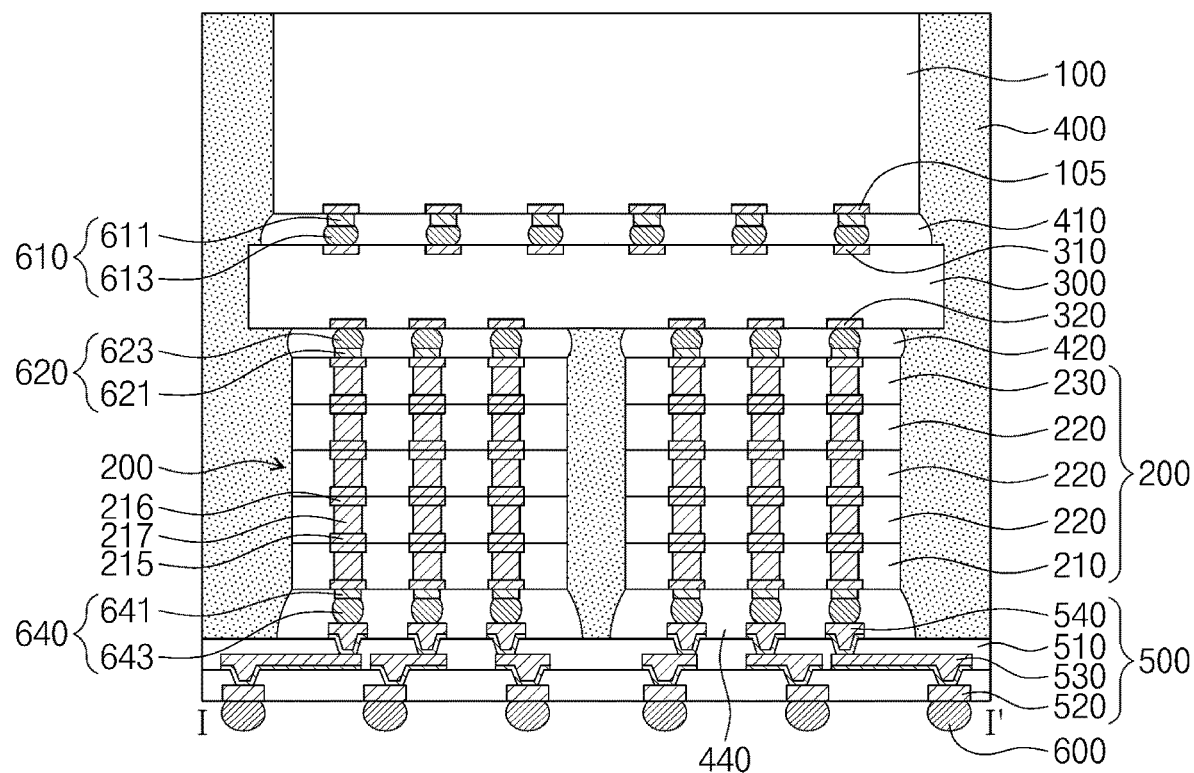
FIG. 6 illustrates a cross-sectional view showing a semiconductor package according to some embodiments.

FIG. 6 illustrates a cross-sectional view taken along line I-I' of FIG. 1A, showing a semiconductor package according to some embodiments.

Referring to FIG. 6, a semiconductor package may include solder terminals 600, a redistribution substrate 500, chip stacks 200, an interposer substrate 300, an upper semiconductor chip 100, and a molding layer 400. The chip stacks 200 may include first, second, and third lower semiconductor chips 210, 220, and 230. The first lower semiconductor chip 210 may have a top surface that contacts a bottom surface of a lowermost second lower semiconductor chip 220. A top surface of the second lower semiconductor chip 220 may contact a bottom surface of a neighboring second lower semiconductor chip 220. An uppermost second lower semiconductor chip 220 may have a top surface that contacts a bottom surface of the third lower semiconductor chip 230.

According to some embodiments, two neighboring ones of the lower semiconductor chips 210, 220, and 230 may be directly bonded to each other. The phrase "two chips are directly bonded to each other" may include the meaning that "facing conductive components of the two chips are directly bonded to each other" and the meaning that "facing dielectric components of the two chips are directly bonded to each other." The phrase "dielectric components are directly bonded to each other" may include but is not limited to the meaning that "a chemical bond is formed between the dielectric components." The conductive components may include lower conductive pads 215 and upper conductive pads 216. A chemical bond may be formed between two facing neighboring dielectric patterns of the first, second, and third lower semiconductor chips 210, 220, and 230. The dielectric patterns may include silicon oxide, but the present inventive concepts are not limited thereto.

Facing upper conductive pads 216 of the first, second, and third lower semiconductor chips 210, 220, and 230 may be directly in physical contact with the lower conductive pads 215. The direct bonding of the first, second, and third lower semiconductor chips 210, 220, and 230 may include applying heat or pressure to the upper conductive pads 216 and the lower conductive pads 215. Therefore, the upper conductive pads 216 may be melted at top surfaces thereof, and the lower conductive pads 215 may be melted at bottom surfaces thereof. The melted top surfaces of the upper conductive pads 216 may be combined with the melted bottom surfaces of the lower conductive pads 215. The phrase "two conductive components are directly bonded to each other" may include the meaning that "contact surfaces of the two conductive components contact each other", the meaning that "contact surfaces of the two components are at least partially melted and combined with each other", or the meaning that "the two components constitute a unitary single structure." Even when two conductive components are directly bonded to constitute a unitary single structure, it may be stated that the two conductive elements contact each other.

Figure 7A:
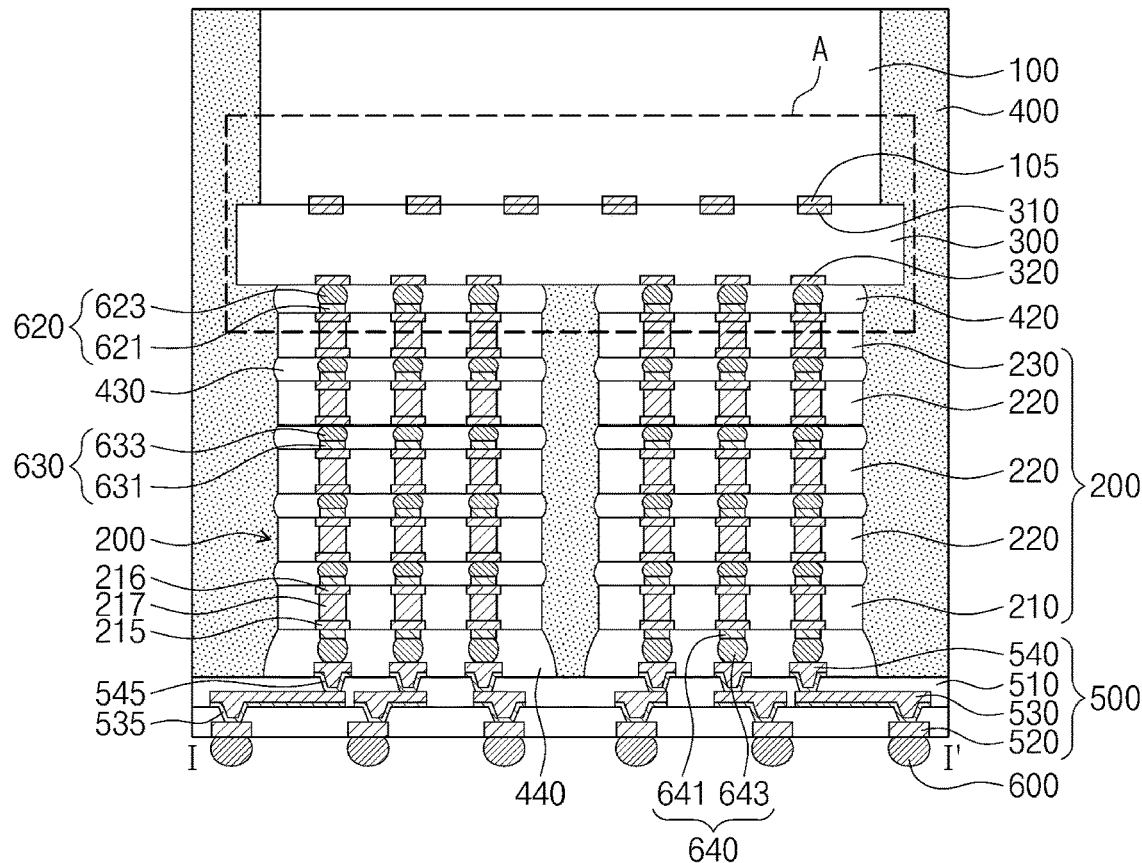
FIG. 7A illustrates a cross-sectional view showing a semiconductor package according to some embodiments.

FIG. 7A illustrates a cross-sectional view taken along line I-I' of FIG. 1A, showing a semiconductor package according to some embodiments.

Referring to FIG. 7A, the upper semiconductor chip 100 may be directly bonded and connected to the interposer substrate 300. A bottom surface of the upper semiconductor chip 100 may contact a top surface of the interposer substrate 300. For example, the chip pads 105 of the upper semiconductor chip 100 may be directly bonded to the upper pads 310. In this case, the chip pads 105 may be described as chip connection terminals.

The redistribution layer discussed in FIG. 1E or 1F may be used as the interposer substrate 300. Alternatively, the interposer substrate 300 may be the semiconductor interposer substrate discussed in the example of FIG. 1C. In this case, a dielectric pattern on the bottom surface of the upper semiconductor chip 100 may be directly bonded to a dielectric layer (e.g., 312 of FIG. 1C) on a top surface of the interposer substrate 300, and a chemical bond may be provided between the dielectric pattern on the bottom surface of the upper semiconductor chip 100 and the dielectric layer 312 on the top surface of the interposer substrate 300. The dielectric pattern on the bottom surface of the upper semiconductor chip 100 may be or may include silicon oxide.

Figure 7B:
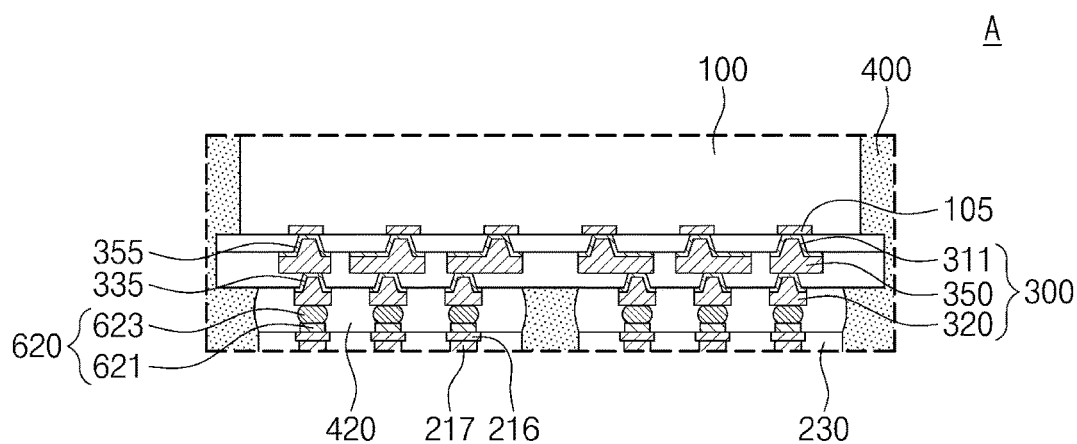
FIG. 7B illustrates a cross-sectional view showing bonding between an upper semiconductor chip and an interposer substrate according to some embodiments.

FIG. 7B illustrates an enlarged cross-sectional view of section A depicted in FIG. 7A, showing bonding between an upper semiconductor chip and an interposer substrate according to some embodiments.

Referring to FIG. 7B, the interposer substrate 300 may be a redistribution layer. For example, the interposer substrate 300 may include organic dielectric layers 311, second redistribution patterns 350, second seed layers 355, second seed pads 335, and lower pads 320. The interposer substrate 300 may not include separate upper pads (see 310 of FIG. 1F or 7A).

An upper portion of each of the second redistribution patterns 350 may vertically overlap a corresponding chip pad 105 of the upper semiconductor chip 100. The upper portion of each of the second redistribution patterns 350 may be the second via part that is discussed above. The second seed layers 355 may be interposed between the second redistribution patterns 350 and a plurality of chip pads 105. The second seed layers 355 may contact the chip pads 105. An uppermost organic dielectric layer 311 may be directly in physical contact with the bottom surface of the interposer substrate 300.

Figure 8A:
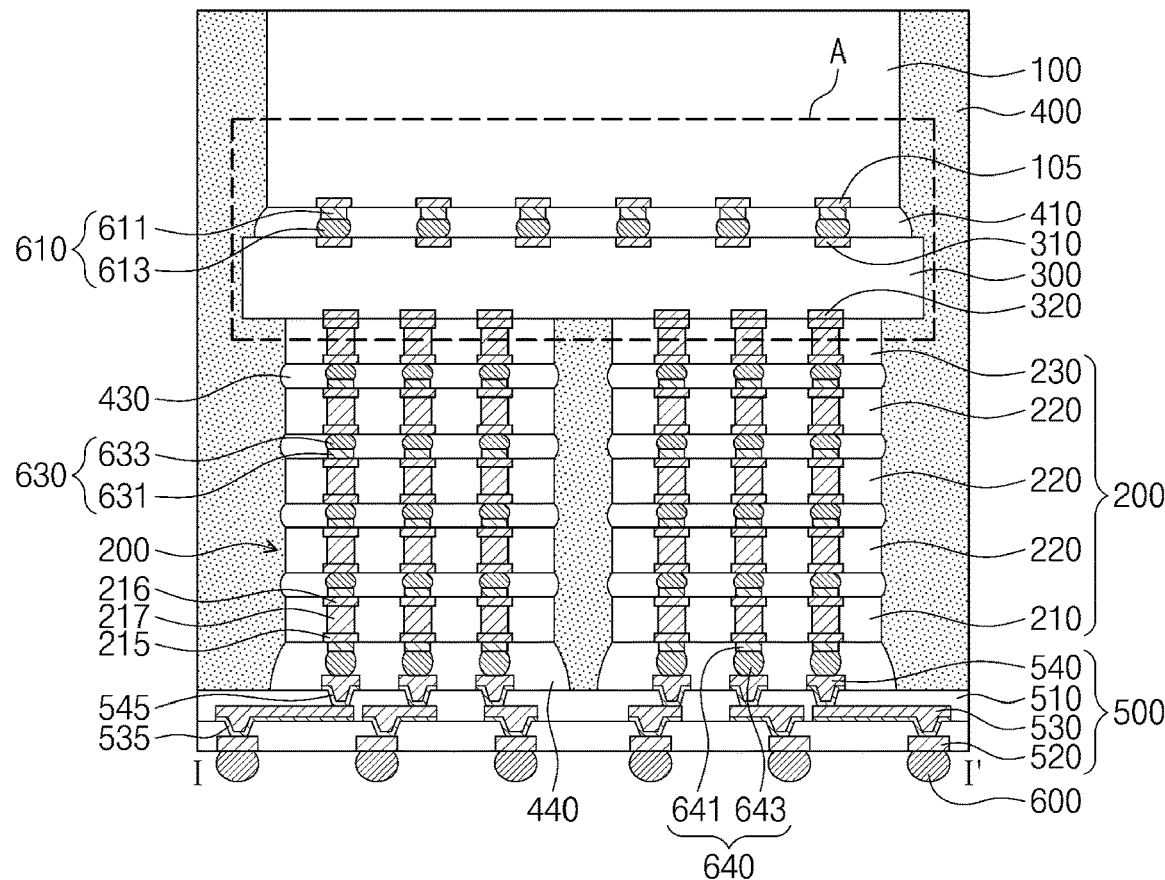
FIG. 8A illustrates a cross-sectional view showing a semiconductor package according to some embodiments.

FIG. 8A illustrates a cross-sectional view taken along line I-I' of FIG. 1A, showing a semiconductor package according to some embodiments.

Referring to FIG. 8A, the third lower semiconductor chip 230 may have a top surface that contacts a bottom surface of the interposer substrate 300. The redistribution layer discussed in FIG. 1E or 1F may be used as the interposer substrate 300. Alternatively, the interposer substrate 300 may be the semiconductor interposer substrate discussed in the example of FIG. 1D.

The third lower semiconductor chip 230 may be directly bonded and connected to the interposer substrate 300. For example, the upper conductive pads 216 of the third lower semiconductor chip 230 may be directly bonded to the lower pads 320 of the interposer substrate 300. A dielectric pattern on the top surface of the third lower semiconductor chip 230 may be directly bonded to a dielectric layer (see 313 of FIG. 1D) on the bottom surface of the interposer substrate 300. For example, a chemical bond may be provided between the dielectric pattern on the top surface of the third lower semiconductor chip 230 may be directly bonded to the dielectric layer (see 313 of FIG. 1D) on the bottom surface of the interposer substrate 300. In this case, the dielectric pattern on the top surface of the third lower semiconductor chip 230 may be or may include silicon oxide.

Figure 8B:
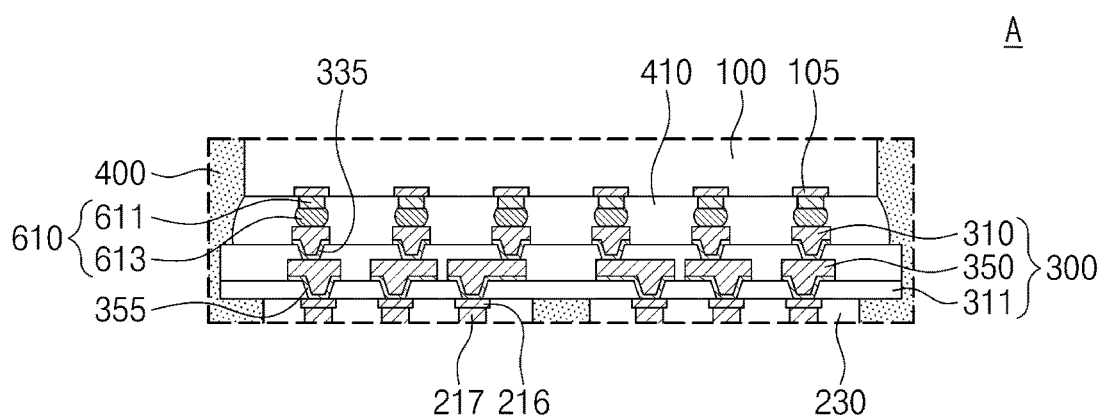
FIG. 8B illustrates a cross-sectional view showing bonding between a third lower semiconductor chip and an interposer substrate according to some embodiments.

FIG. 8B illustrates an enlarged cross-sectional view of section A depicted in FIG. 8A, showing bonding between a third lower semiconductor chip and an interposer substrate according to some embodiments.

Referring to FIG. 8B, the interposer substrate 300 may be a redistribution layer as discussed in FIG. 1E. For example, the interposer substrate 300 may include organic dielectric layers 311, second redistribution patterns 350, second seed layers 355, second seed pads 335, and upper pads 310. The redistribution layer may not include the lower pads (see 320 of FIG. 1E or 8A). The second redistribution patterns 350 may be provided on corresponding upper conductive pads 216 of the third lower semiconductor chip 230. The second seed layers 355 may be interposed between a plurality of upper conductive pads 216 and the second redistribution patterns 350. The second seed layers 355 may contact the upper conductive pads 216. A lowermost organic dielectric layer 311 may contact the top surface of the third lower semiconductor chip 230.

Figure 9:
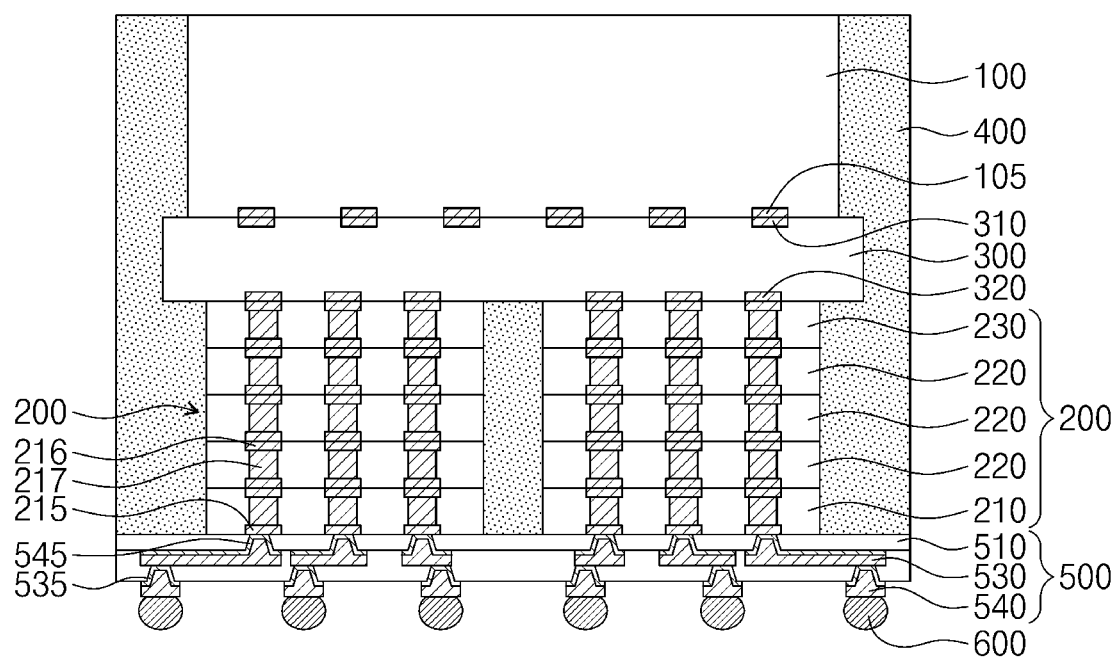
FIG. 9 illustrates a cross-sectional view showing a semiconductor package according to some embodiments.

FIG. 9 illustrates a cross-sectional view taken along line I-I' of FIG. 1A, showing a semiconductor package according to exemplary embodiments.

Referring to FIG. 9, as discussed in FIG. 7A, the upper semiconductor chip 100 may be directly bonded and connected to the interposer substrate 300. Alternatively, the bonding between the upper semiconductor chip 100 and the interposer substrate 300 may be the same as that discussed in FIG. 7B. As discussed in FIG. 8A, the interposer substrate 300 may be directly bonded and connected to the third lower semiconductor chip 230. Alternatively, the bonding between the upper semiconductor chip 100 and the interposer substrate 300 may be the same as that discussed in FIG. 8B. The first, second, and third lower semiconductor chips 210, 220, and 230 may be directly bonded to each other. The direct bonding between the first, second, and third lower semiconductor chips 210, 220, and 230 may be the same as that discussed in FIG. 6.

The redistribution substrate 500 may be substantially the same as that discussed in the example of FIGS. 3A and 3B. For example, the first seed layers 535 may be directly coupled to the lower conductive pads 215 of the first lower semiconductor chip 210. An uppermost organic layer 510 may be directly coupled to a bottom surface of the first lower semiconductor chip 210.

Figure 10A:
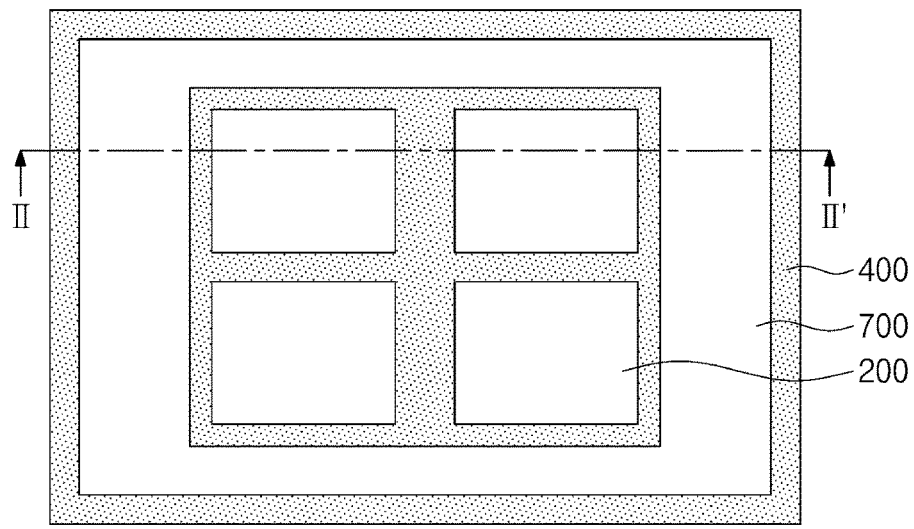
FIG. 10A illustrates a plan view showing chip stacks, a dummy structure, and a molding layer of a semiconductor package according to some embodiments.
Figure 10B:
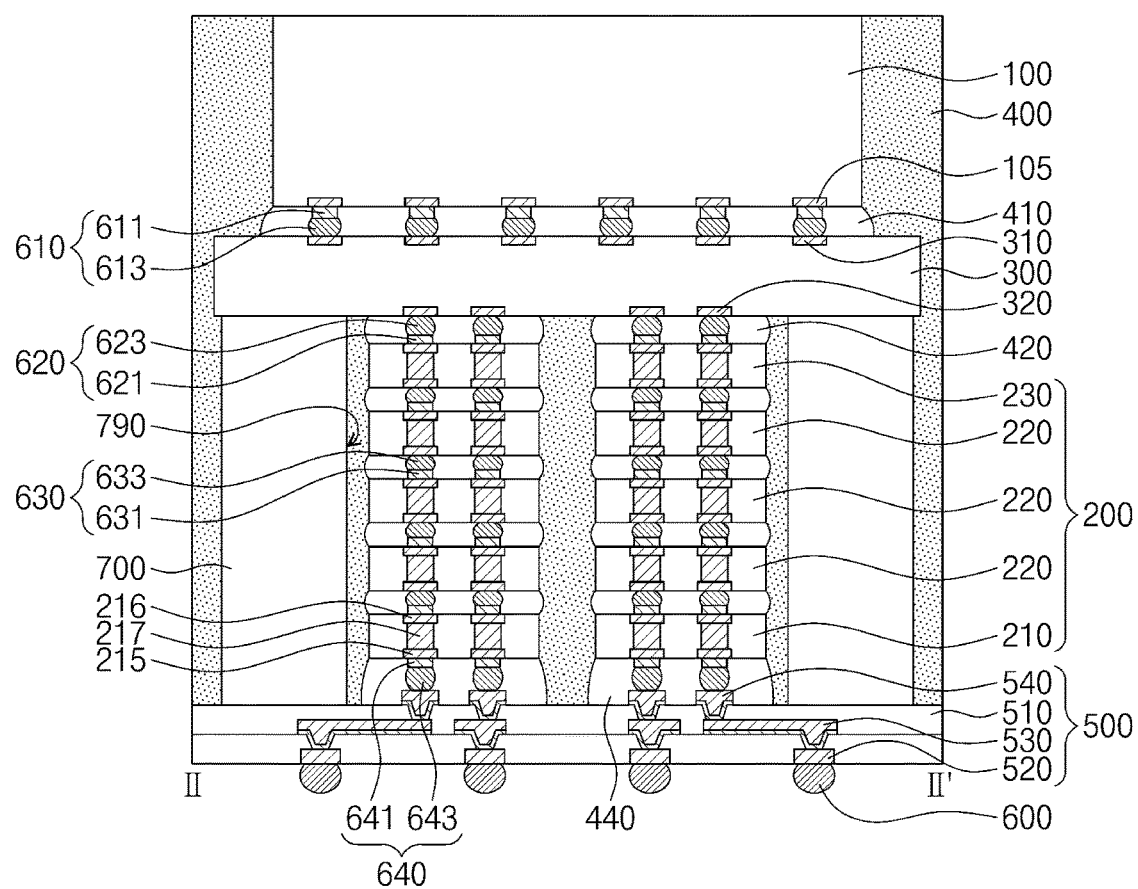
FIG. 10B illustrates a cross-sectional view taken along line II-II' of FIG. 10A, showing a semiconductor package according to some embodiments.

FIG. 10A illustrates a plan view showing chip stacks, a dummy structure, and a molding layer of a semiconductor package according to some embodiments. FIG. 10B illustrates a cross-sectional view taken along line II-II' of FIG. 10A, showing a semiconductor package according to some embodiments.

Referring to FIGS. 10A and 10B, a semiconductor package may include solder terminals 600, a redistribution substrate 500, chip stacks 200, a dummy structure 700, an interposer substrate 300, an upper semiconductor chip 100, and a molding layer 400. When viewed in plan view, the interposer substrate 300 may have a central region and an edge region. When viewed in plan view, the edge region of the interposer substrate 300 may be provided between the central region and a sidewall of the interposer substrate 300.

The chip stacks 200 may be provided on a bottom surface at the central region of the interposer substrate 300. The dummy structure 700 may be provided on a bottom surface at the edge region of the interposer substrate 300. For example, the dummy structure 700 may be interposed between the redistribution substrate 500 and the interposer substrate 300, to extend from the redistribution substrate 500 to the interposer substrate 300. The dummy structure 700 may contact both the redistribution substrate 500 and the interposer substrate 300 and may support the edge region of the interposer substrate 300. Therefore, the interposer substrate 300 may be more stably fixed. The dummy structure may surround the central region, from a plan view, to surround the chip stacks 200.

The dummy structure 700 may have a hole 790 that penetrates therethrough. The chip stacks 200 may be provided in the hole 790 of the dummy structure 700. The chip stacks 200 may be spaced apart from an inner sidewall of the dummy structure 700. The dummy structure 700 may be formed from a semiconductor die or a silicon wafer. The semiconductor die may include, for example, silicon. The dummy structure 700 may not include integrated circuits. The dummy structure 700 may also be described as a support structure.

The redistribution substrate 500 may be provided on its top surface with the molding layer 400 that covers inner and outer sidewalls of the dummy structure 700. The molding layer 400 may be provided between the chip stacks 200 and the dummy structure 700 and between the chip stacks 200. The molding layer 400 may extend onto a sidewall of the interposer substrate 300 and a sidewall of the upper semiconductor chip 100. Though the dummy structure is shown in connection with FIGS. 10A and 10B, it may be included in any of the embodiments described previously, particularly of those embodiments include one or more upper semiconductor chips having a larger area, and chip stacks having a smaller area, than those shown in the previous embodiments.

The molding layer 400 may have a thermal expansion coefficient greater than those of the first, second, and third lower semiconductor chips 210, 220, and 230. When an excessively large difference in thermal expansion coefficient is provided between the molding layer 400 and the lower semiconductor chips 210, 220, and 230, the molding layer 400 may be separated from the first, second, and third lower semiconductor chips 210, 220, and 230. According to some embodiments, the dummy structure 700 may have a thermal expansion coefficient less than that of the molding layer 400. For example, a difference in thermal expansion coefficient between the dummy structure 700 and the first, second, and third lower semiconductor chips 210, 220, and 230 may be less than that between the molding layer 400 and the first, second, and third lower semiconductor chips 210, 220, and 230. The dummy structure 700 may counterbalance the difference in thermal expansion coefficient between the molding layer 400 and the first, second, and third lower semiconductor chips 210, 220, and 230. Therefore, the molding layer 400 may be prevented from being separated from the first, second, and third lower semiconductor chips 210, 220, and 230.

Figure 10C:
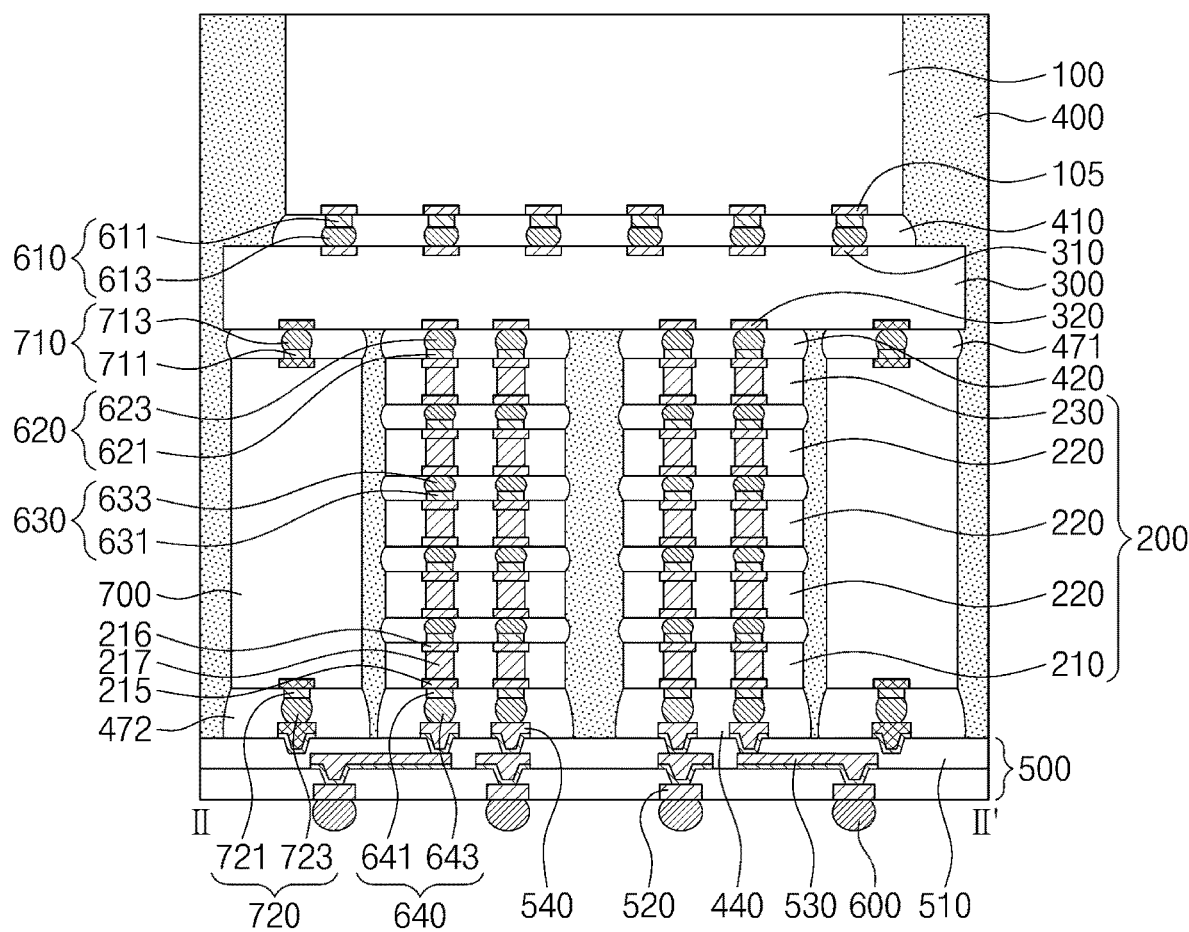
FIG. 10C illustrates a cross-sectional view showing a semiconductor package according to some embodiments.

FIG. 10C illustrates a cross-sectional view taken along line II-II' of FIG. 10A, showing a semiconductor package according to some embodiments.

Referring to FIG. 10C, a semiconductor package may include a dummy structure 700, lower dummy bumps 720, upper dummy bumps 710, a third under-fill pattern 471, and a fourth under-fill pattern 472. The dummy structure 700 may be substantially the same as that discussed with reference to FIGS. 10A and 10B.

The upper dummy bumps 710 may be interposed between the dummy structure 700 and the interposer substrate 300. The upper dummy bumps 710 may not be electrically connected to any conductive components that transmit signals or voltage to or from the interposer substrate 300. For example, the upper dummy bumps 710 may be insulated from wiring lines of the interposer substrate 300. Each of the upper dummy bumps 710 may include a first dummy solder ball 713 and a first dummy pillar pattern 711. The first dummy pillar pattern 711 may be provided on a top surface of the dummy structure 700. The first dummy pillar pattern 711 may be or may include, for example, copper. The first dummy solder ball 713 may be interposed between the first dummy pillar pattern 711 and the interposer substrate 300. Alternatively, each of the upper dummy bumps 710 may not include the first dummy pillar pattern 711.

The third under-fill pattern 471 may be interposed between the dummy structure 700 and the interposer substrate 300, and may cover sidewalls of the upper dummy bumps 710. The third under-fill pattern 471 may include a dielectric polymer different from that of the molding layer 400.

The lower dummy bumps 720 may be interposed between the redistribution substrate 500 and the dummy structure 700. The lower dummy bumps 720 may be insulated from the first redistribution patterns 530. Each of the lower dummy bumps 720 may include a second dummy solder ball 723 and a second dummy pillar pattern 721. The second dummy solder ball 723 may be provided on a top surface of the redistribution substrate 500. The second dummy pillar pattern 721 may be interposed between the first dummy solder ball 713 and the dummy structure 700. The second dummy pillar pattern 721 may be or may include, for example, copper. Alternatively, each of the lower dummy bumps 720 may not include the second dummy pillar pattern 721.

The fourth under-fill pattern 472 may be interposed between the dummy structure 700 and the redistribution substrate 500, and may cover sidewalls of the lower dummy bumps 720. The fourth under-fill pattern 472 may include a dielectric polymer different from that of the molding layer 400.

Figure 10D:
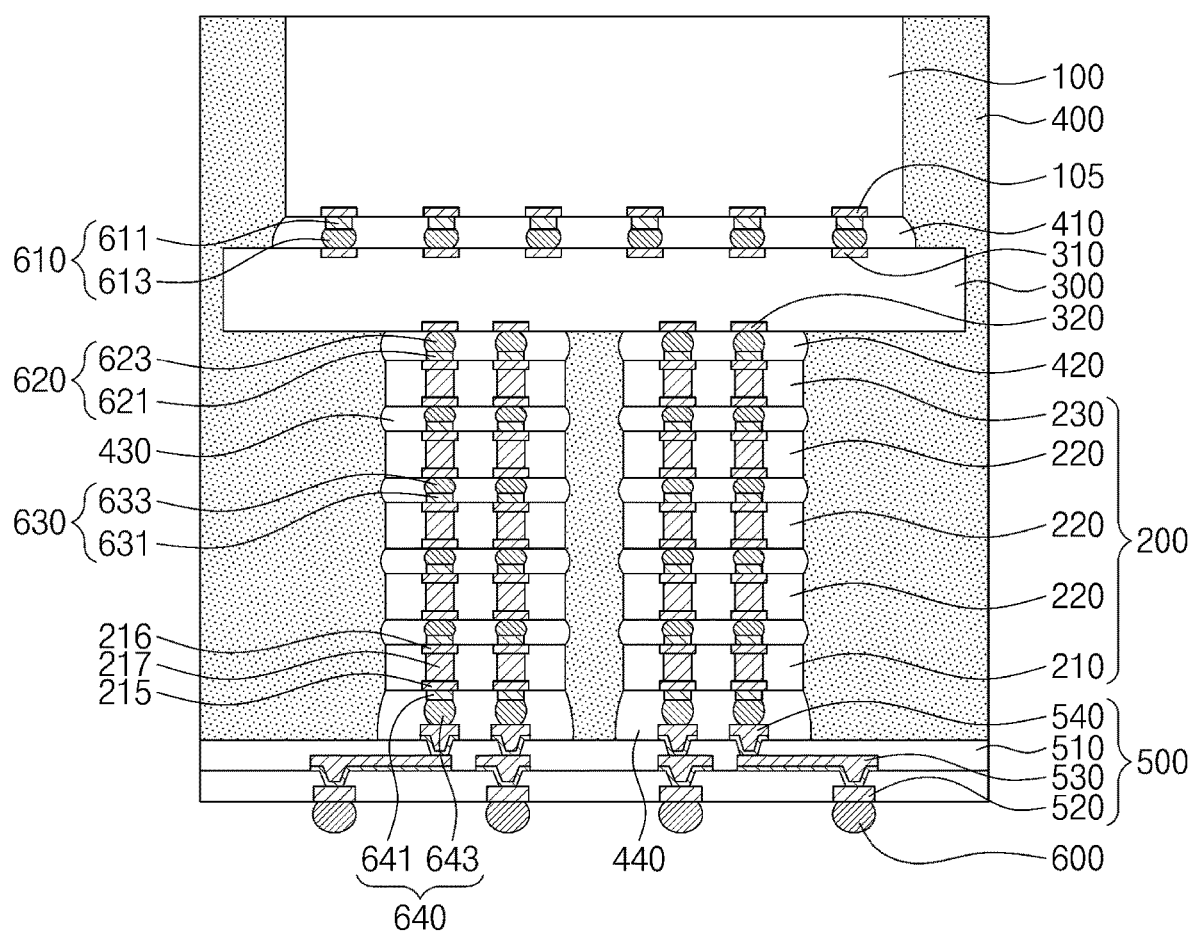
FIG. 10D illustrates a cross-sectional view showing a semiconductor package according to some embodiments.

FIG. 10D illustrates a cross-sectional view taken along line II-II' of FIG. 10A, showing a semiconductor package according to some embodiments.

Referring to FIG. 10D, a semiconductor package may include solder terminals 600, a redistribution substrate 500, chip stacks 200, an interposer substrate 300, an upper semiconductor chip 100, and a molding layer 400. The chip stacks 200 may be provided on a bottom surface at a central region of the interposer substrate 300. The chip stack 200 may be provided on a bottom surface at an edge region of the interposer substrate 300. The molding layer 400 may fill a space between the redistribution substrate 500 and the bottom surface at the edge region of the interposer substrate 300. The molding layer 400 may support the edge region of the interposer substrate 300.

Figure 11A:
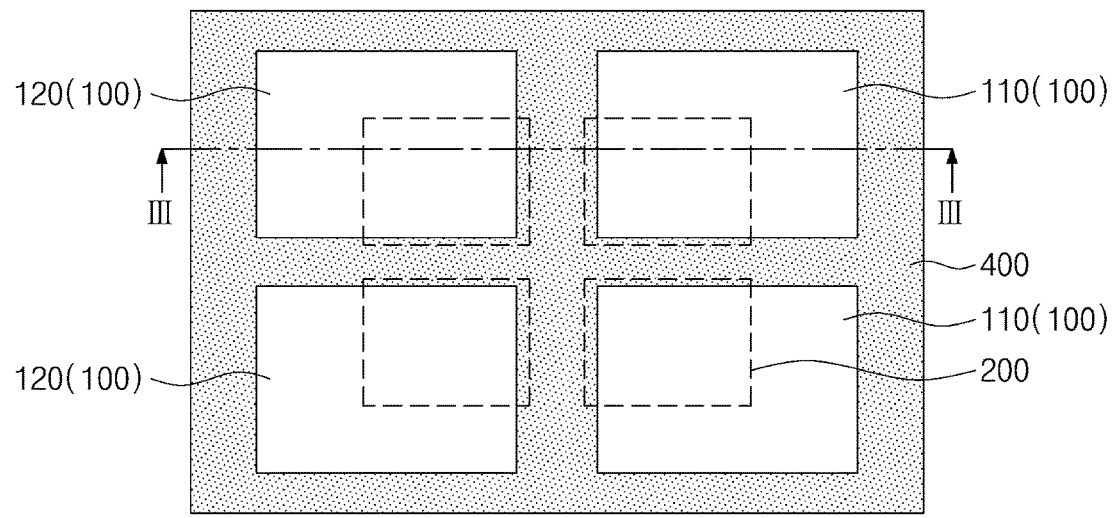
FIG. 11A illustrates a plan view showing chip stacks, an upper semiconductor chip, and a molding layer of a semiconductor package according to some embodiments.
Figure 11B:
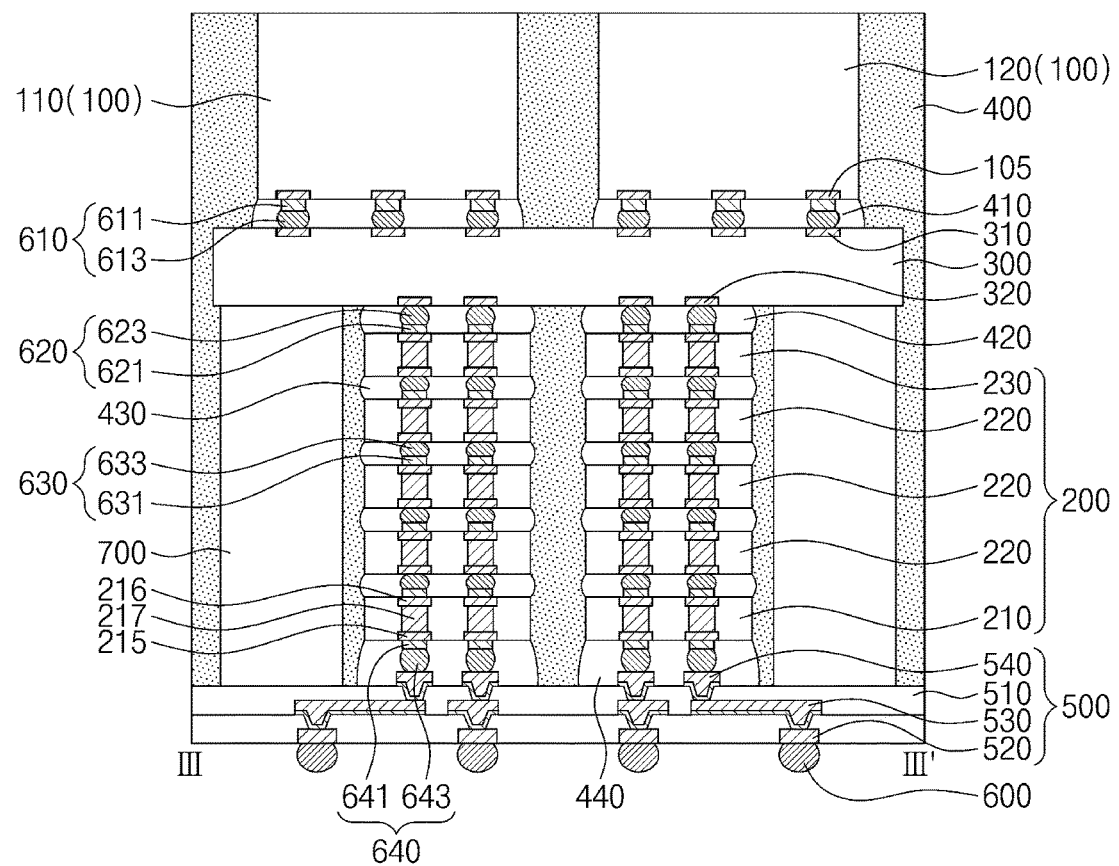
FIG. 11B illustrates a cross-sectional view taken along line III-III' of FIG. 11A, showing a semiconductor package according to some embodiments.

FIG. 11A illustrates a plan view showing chip stacks, upper semiconductor chips, and a molding layer of a semiconductor package according to some embodiments. FIG. 11B illustrates a cross-sectional view taken along line III-III' of FIG. 11A, showing a semiconductor package according to some embodiments. FIG. 11B corresponds to a cross-section taken along line II-II' of FIG. 10A.

Referring to FIGS. 11A and 11B, a semiconductor package may include solder terminals 600, a redistribution substrate 500, chip stacks 200, a dummy structure 700, an interposer substrate 300, an upper semiconductor chip 100, and a molding layer 400. The upper semiconductor chip 100 may include a plurality of upper semiconductor chips. The plurality of upper semiconductor chips 100 may include a first pair of upper semiconductor chips 110 and a second pair of upper semiconductor chips 120. Each semiconductor chip of the first pair of upper semiconductor chips 110 and the second pair of upper semiconductor chips 120 may be substantially the same as or similar to the upper semiconductor chips 110 and 120 discussed in the example of FIGS. 5A and 5B. As shown in FIG. 11A, the number of first upper semiconductor chips 110 may be two, and the number of second upper semiconductor chips 120 may also be two. However, the number of the first upper semiconductor chips 110 may be greater than two, and the number of the second upper semiconductor chips 120 may be greater than two, and the number of first upper semiconductor chips 110 may be the same as or different from the number of second upper semiconductor chips 120.

Figure 12A:
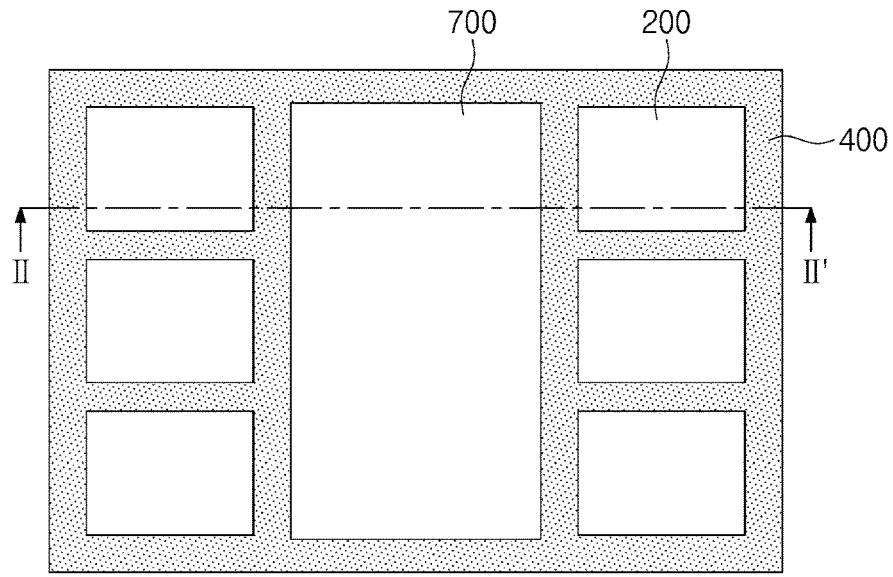
FIG. 12A illustrates a plan view showing chip stacks, a dummy structure, and a molding layer of a semiconductor package according to some embodiments.
Figure 12B:
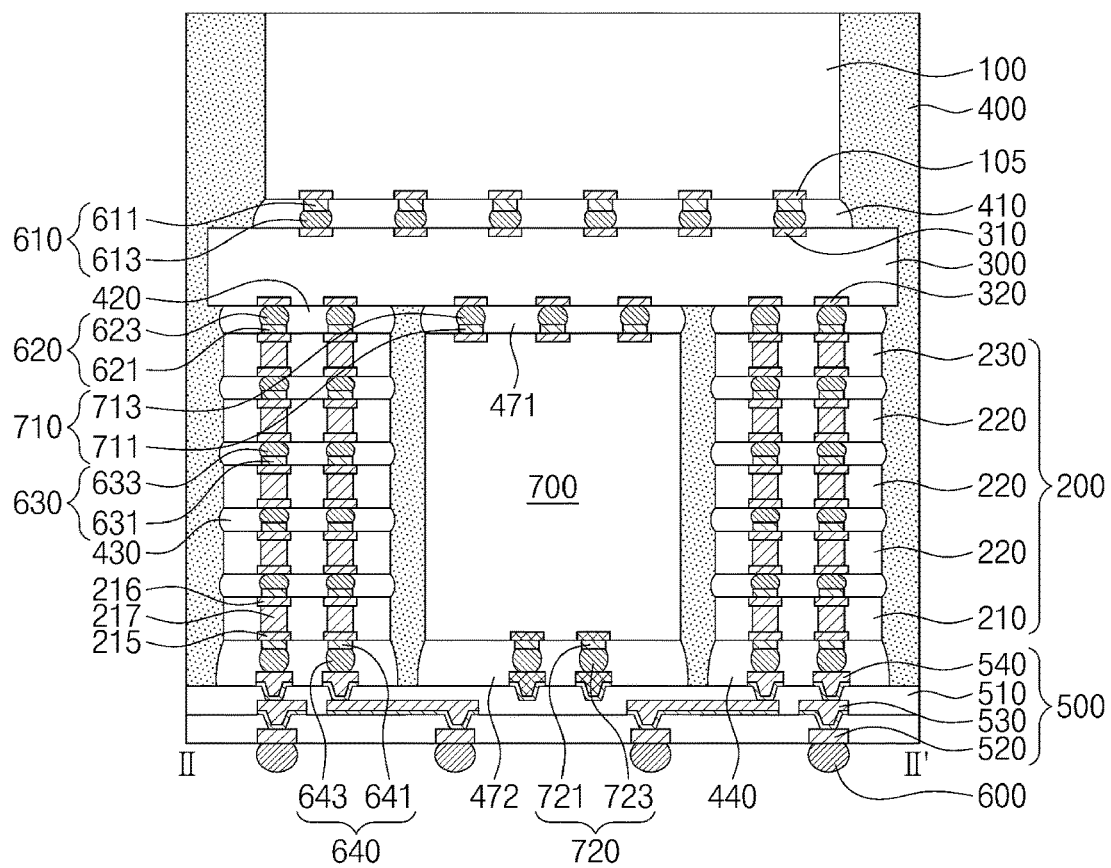
FIG. 12B illustrates a cross-sectional view taken along line II-II' of FIG. 12A, showing a semiconductor package according to some embodiments.

FIG. 12A illustrates a plan view showing chip stacks, a dummy structure, and a molding layer of a semiconductor package according to some embodiments. FIG. 12B illustrates a cross-sectional view taken along line II-II' of FIG. 12A, showing a semiconductor package according to some embodiments.

Referring to FIGS. 12A and 12B, a semiconductor package may include solder terminals 600, a redistribution substrate 500, chip stacks 200, a dummy structure 700, an interposer substrate 300, an upper semiconductor chip 100, and a molding layer 400.

When viewed in plan view, the chip stacks 200 may be provided on a bottom surface at an edge region of the interposer substrate 300. When viewed in plan view, the dummy structure 700 may be provided on a bottom surface at a central region of the interposer substrate 300. For example, the dummy structure 700 may be provided between and laterally spaced apart from the chip stacks 200. The molding layer 400 may be interposed between the chip stacks 200 and the dummy structure 700, while covering sidewalls of the chip stacks 200 and sidewalls of the dummy structure 700.

The semiconductor package may further include upper dummy bumps 710, lower dummy bumps 720, a third under-fill pattern 471, and a fourth under-fill pattern 472. The upper dummy bumps 710, the lower dummy bumps 720, the third under-fill pattern 471, and the fourth under-fill pattern 472 may be provided on a bottom surface at a central region of the interposer substrate 300.

An arrangement of the chip stacks 200 and the dummy structure 700 is not limited to that shown, but may be variously changed. For example, one of the chip stacks 200 may be provided on the bottom surface at the edge region of the interposer substrate 300, and another of the chip stacks 200 may be provided on the bottom surface at the central region of the interposer substrate 300. In this case, the dummy structure 700 may be located laterally spaced apart from the chip stacks 200, and may support the interposer substrate 300.

Figure 12C:
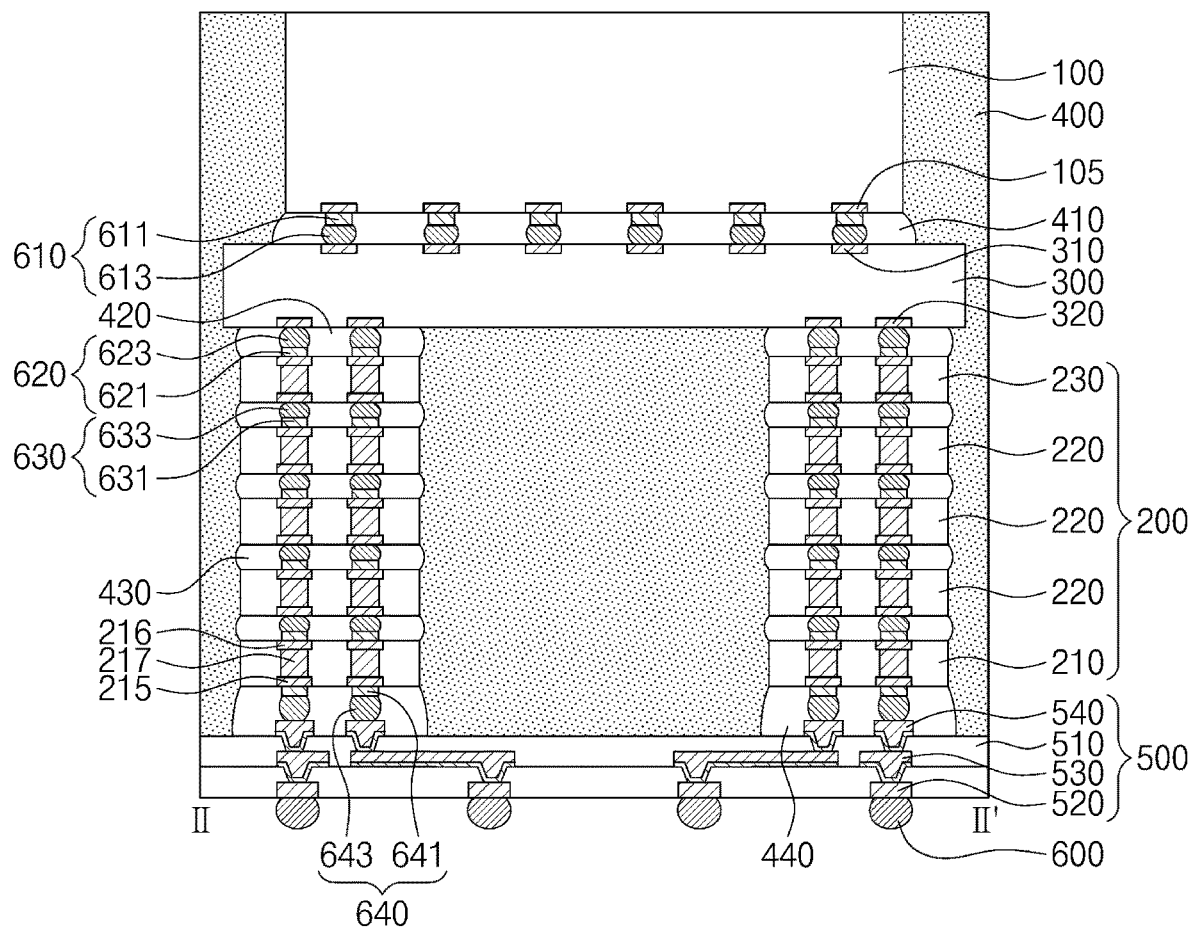
FIG. 12C illustrates a cross-sectional view showing a semiconductor package according to some embodiments.

FIG. 12C illustrates a cross-sectional view showing a semiconductor package according to some embodiments.

Referring to FIG. 12C a semiconductor package may include solder terminals 600, a redistribution substrate 500, chip stacks 200, an interposer substrate 300, an upper semiconductor chip 100, and a molding layer 400. When viewed in plan view, the chip stacks 200 may be provided on a bottom surface at an edge region of the interposer substrate 300. The chip stacks 200 may not be provided on a bottom surface at a central region of the interposer substrate 300. The molding layer 400 may be located on an area between the redistribution substrate 500 and the bottom surface at the central region of the interposer substrate 300. The molding layer 400 may support the central region of the interposer substrate 300.

The embodiments of the present inventive concepts may be variously combined with each other. For example, the thermal radiation structure 900 discussed in the example of FIG. 2 may further be included in at least one selected from the semiconductor package of FIGS. 1A and 1B, the semiconductor package of FIGS. 3A and 3B, the semiconductor package of FIG. 4, the semiconductor package of FIGS. 5A and 5B, the semiconductor package of FIG. 6, the semiconductor package of FIG. 7A, the semiconductor package of FIG. 8A, the semiconductor package of FIG. 9, the semiconductor package of FIGS. 10A and 10B, the semiconductor package of FIG. 10C, the semiconductor package of FIG. 10D, the semiconductor package of FIGS. 11A and 11B, the semiconductor package of FIGS. 12A and 12B, and the semiconductor package of FIG. 12C.

Figure 13:
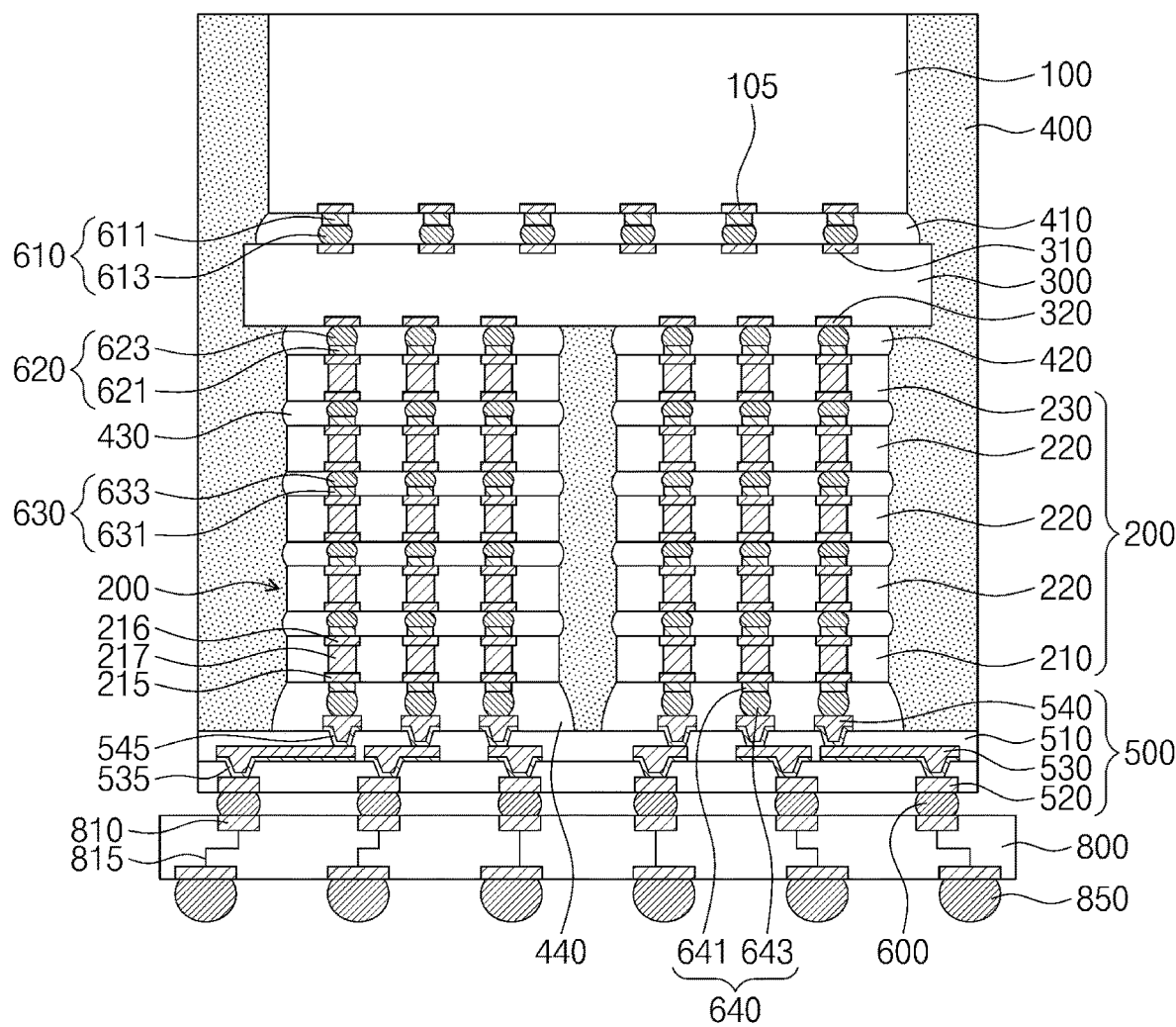
FIG. 13 illustrates a cross-sectional view showing a stacked semiconductor package according to some embodiments.

FIG. 13 illustrates a cross-sectional view showing a stacked semiconductor package according to some embodiments.

Referring to FIG. 13, a stacked semiconductor package may include a package substrate 800 and a semiconductor package. The package substrate 800 may be a printed circuit board (PCB). The package substrate 800 may include substrate pads 810 and internal lines 815. The substrate pads 810 may be provided on a top surface of the package substrate 800. The internal lines 815 may be located in the package substrate 800 and may be coupled to corresponding substrate pads 810. The phrase "coupled to the package substrate 800" may mean "coupled to at least one of the internal lines 815." The substrate pads 810 and the internal lines 815 may be or may include metal. External terminals 850 may be disposed on a bottom surface of the package substrate 800. External electrical signals may be transmitted through the external terminals 850 to the package substrate 800. The external terminals 850 may include or may be solder balls. The external terminals 850 may include or may be metal, such as a solder material. The external terminals 850 may be external package connection terminals.

The semiconductor package may be mounted on the package substrate 800. The semiconductor package may be substantially the same as the semiconductor package of FIGS. 1A and 1B. For example, the semiconductor package may include a redistribution substrate 500, solder terminals 600, an interposer substrate 300, chip stacks 200, an upper semiconductor chip 100, and a molding layer 400. The mounting of the semiconductor package on the package substrate 800 may include coupling the solder terminals 600 to corresponding substrate pads 810.

Differently from that shown, the package substrate 800 may be provided thereon with the semiconductor package of FIGS. 1A and 1B, the semiconductor package of FIGS. 3A and 3B, the semiconductor package of FIG. 4, the semiconductor package of FIGS. 5A and 5B, the semiconductor package of FIG. 6, the semiconductor package of FIG. 7A, the semiconductor package of FIG. 8A, the semiconductor package of FIG. 9, the semiconductor package of FIGS. 10A and 10B, the semiconductor package of FIG. 10C, the semiconductor package of FIG. 10D, the semiconductor package of FIGS. 11A and 11B, the semiconductor package of FIGS. 12A and 12B, or the semiconductor package of FIG. 12C.

According to the present inventive concepts, an upper semiconductor chip and a chip stack may be provided respectively on a top surface and a bottom surface of an interposer substrate. The upper semiconductor chip may be electrically connected through the interposer substrate to the chip stack. Therefore, a reduced electrical path may be provided between the upper semiconductor chip and the chip stack. An increased signal transfer speed may be provided between the upper semiconductor chip and the chip stack. A semiconductor package may exhibit improved electrical characteristics. The semiconductor package may become compact-sized.

This detailed description of the present inventive concepts should not be construed as limited to the embodiments set forth herein, and it is intended that the present inventive concepts cover the various combinations, the modifications and variations of this invention without departing from the spirit and scope of the present inventive concepts.

What is claimed is:
1. A semiconductor package, comprising:
an interposer substrate;
an upper semiconductor chip on a top surface of the interposer substrate, such that a bottom surface of the upper semiconductor chip faces the top surface of the interposer substrate;
a chip stack on a bottom surface of the interposer substrate, the chip stack including a plurality of stacked lower semiconductor chips, each of the lower semiconductor chips including a plurality of through vias therein, wherein a top surface of the chip stack faces the bottom surface of the interposer substrate;
a molding layer that covers a sidewall of the chip stack, a sidewall of the interposer substrate, and a sidewall of the upper semiconductor chip; and
a plurality of connection terminals disposed below a bottom surface of the chip stack opposite the top surface of the chip stack, and coupled to the through vias, wherein the upper semiconductor chip is electrically connected through the interposer substrate to the through vias, and wherein the interposer substrate has a larger area than the top surface of the chip stack from a plan view.

2. The semiconductor package of claim 1, wherein
the chip stack is a first chip stack that is part of a plurality of chip stacks that are laterally spaced apart from each other, and
the molding layer is between the chip stacks.

3. The semiconductor package of claim 1, further comprising a redistribution substrate on the bottom surface of the chip stack and a bottom surface of the molding layer,
wherein the connection terminals are on a bottom surface of the redistribution substrate.

4. The semiconductor package of claim 3, wherein at least one of the connection terminals vertically overlaps the bottom surface of the molding layer.

5. The semiconductor package of claim 3, further comprising a dummy structure extending from the redistribution substrate to the interposer substrate,
wherein the dummy structure is laterally spaced apart from the chip stack.

6. The semiconductor package of claim 5, wherein the dummy structure has a thermal expansion coefficient less than a thermal expansion coefficient of the molding layer.

7. The semiconductor package of claim 1, further comprising a plurality of bumps between the interposer substrate and the upper semiconductor chip,
wherein a pitch of the bumps is less than a pitch of the connection terminals.

8. The semiconductor package of claim 1, further comprising a plurality of bumps between the interposer substrate and the chip stack,
wherein a pitch of the bumps is less than a pitch of the connection terminals.

9. The semiconductor package of claim 1, wherein the upper semiconductor chip is part of a plurality of upper semiconductor chips, and includes:
a first upper semiconductor chip; and
a second upper semiconductor chip laterally spaced apart from the first upper semiconductor chip,
wherein the second upper semiconductor chip includes a logic chip that is of a different type from the first upper semiconductor chip.

10. A semiconductor package, comprising:
an interposer substrate;
an upper semiconductor chip on a top surface of the interposer substrate;
a plurality of chip stacks on a bottom surface of the interposer substrate and laterally spaced apart from each other, each chip stack of the plurality of chip stacks attached to and electrically connected to a bottom surface of the interposer substrate; and
a molding layer that covers sidewalls of the chip stacks, a sidewall of the interposer substrate, and a sidewall of the upper semiconductor chip, the molding layer being between the chip stacks,
wherein each of the chip stacks includes a plurality of stacked lower semiconductor chips.

11. The semiconductor package of claim 10, further comprising a plurality of solder terminals on bottom surfaces of the chip stacks,
wherein each of the lower semiconductor chips includes a plurality of through vias therein,
wherein the through vias are coupled to the solder terminals.

12. The semiconductor package of claim 10, further comprising:
a redistribution substrate on bottom surfaces of the chip stacks and a bottom surface of the molding layer; and
a plurality of solder terminals on a bottom surface of the redistribution substrate,
wherein the redistribution substrate includes an organic dielectric layer and a redistribution pattern in the organic dielectric layer.

13. The semiconductor package of claim 10, wherein a bottom surface of the upper semiconductor chip contacts the top surface of the interposer substrate.

14. The semiconductor package of claim 10, wherein
the lower semiconductor chips include a first lower semiconductor chip, a second lower semiconductor chip, and a third lower semiconductor chip, the first to third lower semiconductor chips being stacked, and
the bottom surface of the interposer substrate contacts the third lower semiconductor chip.

15. The semiconductor package of claim 10, wherein the lower semiconductor chips include:
a first lower semiconductor chip; and
a second lower semiconductor chip on the first lower semiconductor chip,
wherein a top surface of the first lower semiconductor chip contacts a bottom surface of the second lower semiconductor chip.

16. The semiconductor package of claim 10, further comprising:
a redistribution substrate on bottom surfaces of the chip stacks and a bottom surface of the molding layer; and
a dummy structure extending from the redistribution substrate to the interposer substrate,
wherein the dummy structure is laterally spaced apart from the chip stacks, and
wherein the dummy structure has a thermal expansion coefficient less than a thermal expansion coefficient of the molding layer.

17. A semiconductor package, comprising:
an interposer substrate that has a top surface and a bottom surface opposite the top surface;
a logic chip on the top surface of the interposer substrate and coupled to the interposer substrate;
a plurality of chip stacks disposed on the bottom surface of the interposer substrate and laterally spaced apart from each other;
a plurality of solder terminals below bottom surfaces of the chip stacks; and
a molding layer that covers sidewalls of the chip stacks, a sidewall of the interposer substrate, and a sidewall of the logic chip, the molding layer exposing a top surface of the logic chip,
wherein each of the chip stacks includes a plurality of stacked memory chips,
wherein each of the memory chips includes a plurality of through vias therein,
wherein the solder terminals are electrically connected through the through vias to the interposer substrate.

18. The semiconductor package of claim 17, wherein the interposer substrate includes:
a semiconductor substrate;
a plurality of conductive vias that penetrate the semiconductor substrate;
a plurality of dielectric layers on the semiconductor substrate; and
a plurality of wiring structures provided in the dielectric layers and electrically connected to the conductive vias.

19. The semiconductor package of claim 17, wherein the interposer substrate includes:
- an organic dielectric layer;
- a plurality of redistribution patterns provided in the organic dielectric layer and laterally spaced apart from each other; and
- a plurality of redistribution pads on the redistribution patterns,
- wherein the logic chip is electrically connected through the redistribution patterns to the memory chips.

20. The semiconductor package of claim 17, wherein a pitch of the solder terminals is greater than a pitch of chip pads of the logic chip,
- wherein the pitch of the chip pads is in a range of about 10 μm to about 100 μm, and
- wherein the pitch of the solder terminals is in a range of about 101 μm to about 1,000 μm.

* * * * *